United States Patent [19]

Endo

[11] Patent Number: 5,596,214
[45] Date of Patent: Jan. 21, 1997

[54] NON-VOLATILE SEMICONDUCTOR MEMORY DEVICE HAVING A METAL-INSULATOR-SEMICONDUCTOR GATE STRUCTURE AND METHOD FOR FABRICATING THE SAME

[75] Inventor: Nobuhiro Endo, Tokyo, Japan

[73] Assignee: NEC Corporation, Tokyo, Japan

[21] Appl. No.: 453,890

[22] Filed: May 30, 1995

[30] Foreign Application Priority Data

May 30, 1994 [JP] Japan .................................. 6-116394

[51] Int. Cl.$^6$ .................... H01L 29/792; H01L 29/76; H01L 29/94
[52] U.S. Cl. .................... 257/324; 257/325; 257/410; 257/411
[58] Field of Search ............................ 257/324, 325, 257/410, 411

[56] References Cited

U.S. PATENT DOCUMENTS

| | | | |
|---|---|---|---|
| 4,047,214 | 9/1977 | Francombe et al. . | |
| 5,426,075 | 6/1995 | Perino et al. | 437/235 |
| 5,442,585 | 8/1995 | Egnchi et al. | 365/149 |
| 5,478,653 | 12/1995 | Guenzer | 428/446 |
| 5,523,964 | 6/1996 | McMillan et al. | 365/145 |

FOREIGN PATENT DOCUMENTS 62-33753  7/1987  Japan .

OTHER PUBLICATIONS

"Charge Transport and Storage in Metal–Nitride–Oxide–Silicon (MNOS) Structures", *Journal of Applied Physics*, vol. 40, No. 8, pp. 3307–3319 by D. Frohman-Bentchkowsky et al., Jul. 1969.

D. Kahng et al., "Interfacial Dopants for Dual-Dielectric, Charge-Storage Cells", *The Bell System Technical Journal*, Nov. 1974, pp. 1722–1739.

*Primary Examiner*—Ngân V. Ngô
*Attorney, Agent, or Firm*— Young & Thompson

[57] ABSTRACT

There is provided a metal-insulator-semiconductor gate insulating structure involved in a non-volatile memory device. A first insulating layer formed on the semiconductor substrate has a first dielectric constant $\epsilon_1$ and a first thickness of $t_1$. A second insulating layer formed on the first insulating layer layer has a second dielectric constant $\epsilon_2$ and a second thickness of $t_2$. A gate electrode of a metal layer is formed on the second insulating layer. The first and second dielectric constants $\epsilon_1$ and $\epsilon_2$ and the first and second thicknesses $t_1$ and $t_2$ satisfy the conditions of $20 \leq \epsilon_2/\epsilon_1$, and $t_2/t_1 \leq \epsilon_2/\epsilon_1$.

60 Claims, 9 Drawing Sheets

FIG. 9
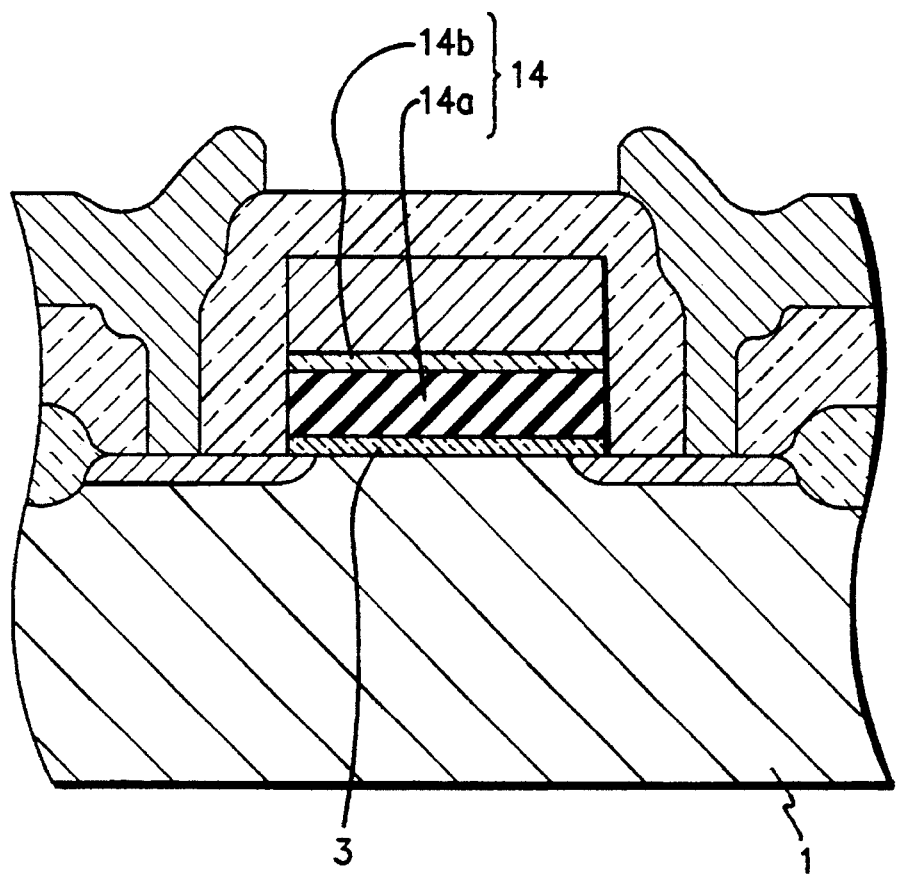
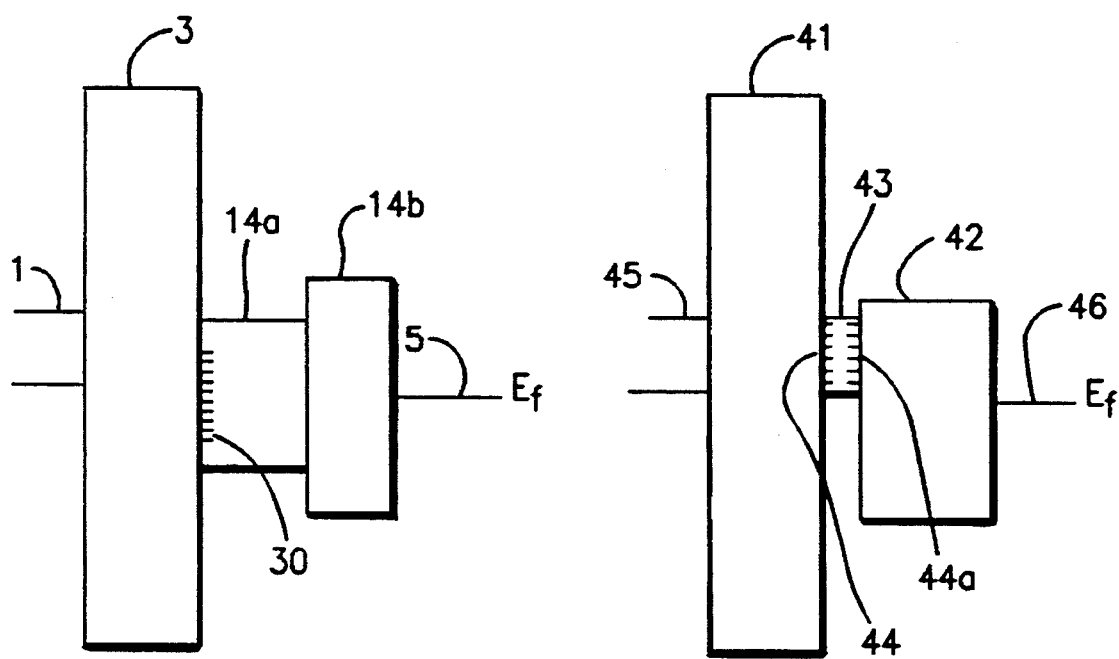
FIG. 10    FIG. 13

NON-VOLATILE SEMICONDUCTOR MEMORY DEVICE HAVING A METAL-INSULATOR-SEMICONDUCTOR GATE STRUCTURE AND METHOD FOR FABRICATING THE SAME

BACKGROUND OF THE INVENTION

The invention relates to a non-volatile semiconductor memory device having a metal-insulating-semiconductor gate structure and a method for fabricating the same. Metal insulator semiconductor devices have been known in the art as a non-volatile semiconductor memory element and may be divided into two different types, one of which is a floating gate memory transistor and another one is a metal-nitride-oxide-semiconductor memory transistor. At this time, the floating gate memory transistor appears to be more widely used than the metal-nitride-oxide-semiconductor memory transistor. The floating gate transistor has dual gate electrodes wherein one is a floating gate completely surrounded by an insulator to be kept in an electrically floating state and provided over a channel region through the insulator and another is a control gate provided over the floating gate through the insulator. The control gate is applied with a positive voltage signal to apply an electric field between the control gate and the channel region so that hot electrons are caused on a channel region of the transistor. This may cause Fowler-Nordheim tunneling of the hot electrons from the channel region through the insulator into the floating gate thereby a write operation of informational signals is then achieved. An erasure operation may be achieved either by thermal means or by ultra violet irradiation to cause discharge of the informational electrons from the floating gate and then the electrons flow into the channel or source regions. The insulator between the channel region and the floating gate has such a large thickness as to cause Fowler-Nordheim tunneling, for example, at least more than 50 angstroms. Such large thickness of the insulator may also allow that the electrons once injected into the floating gate incline to be accumulated within the floating gate for a long time, for example, $1\times10^5$ hours, provided that no electric field is applied across the floating gate during that term. The write state where electrons are accumulated in the floating gate may represent "1" in binary signals, while the erasure state where no or almost no electron remains in the floating gate may represent "0" in binary signals.

It is, however, hard to achieve a complete erasing operation due to a difficulty in exact emission or discharge of all electrons from the floating gate either by thermal means or by ultra violet irradiation. It is a factual matter that the majority of the electrons may be emitted from the floating gate by receiving either thermal means or ultra violet irradiation, while the minority of the electrons inclines to remain in the floating gate. In a subsequent write operation, electrons as another informational signals are further injected by the Fowler-Nordheim tunneling into the floating gate so that a total amount of the electrons in the floating gate is increased by the amount of the electrons having still remained therein after the previous erasing operation. After a subsequent erasing operation, a larger amount of electrons inclines to remain in the floating gate as compared to that after the previous erasing operation. This means that repeat of the sets of the write and erasing operations results in an increase of the amount of the electrons remaining in the floating gate after the erasing operation. As the amount of the electrons existing in the floating gate after the erase operation is gradually increased through repeating the above write and erase operations and may, thereafter, come over a critical amount at which the memory device comes unable to recognize the state "0" in the binary signals. As a result, a possible number of time in repeat of the write and erasing operations is necessarily limited. The maximum number of time in repeating the write and erase operations is in fact insufficient to the required number of time therefor. As the increase of the memory capacity is being now required, a much larger number of time, for example, $10^5$ of the sets of the write and erase operations are required.

As the requirements for increase of the memory capacity have been on the increase, importance in the requirement for increase of a possible number of time of the sets of the write and erasing operations is now on the great increase.

Under the above circumstances, the metal-nitride-oxide-semiconductor memory device comes now receiving a greater deal of attention as an attractive memory device due to its capability of a large number of time in repeat of the sets of the write and erase operations. Actually, a possible number of time of the write and erase operations associated with the metal-nitride-oxide-semiconductor transistor is 10 to $10^2$ times as large as the floating gate transistor since the principal in write erasing operations of the metal-nitride-oxide-semiconductor transistor is completely different from that of the floating gate transistor. It has been known that the above silicon nitride film may be replaced by an aluminium oxide film.

Such metal-nitride-oxide-semiconductor transistors are disclosed, for example, in July 1969 Journal of Applied Physics, Vol. 40, No. 8, pp. 3307–3319 and in November 1974, The Bell System Technical Journal, pp. 1722–1739. A typical metal-nitride-oxide-semiconductor structure is as illustrated in FIG. 1 of the above initial publication and comprises laminations of four layers, namely a semiconductor substrate, a silicon dioxide film formed on the semiconductor substrate, a silicon nitride film formed on the silicon dioxide film and an aluminium gate formed on the silicon nitride film.

The write and erasing operations of the metal-nitride-oxide-semiconductor memory device will hereinafter be described. In the write operation, a positive voltage is applied to the gate electrode so that an electric field is applied across the above four layer laminations to cause hot electrons on a surface region of the semiconductor substrate. The hot electrons may show either a Fowler-Nordheim tunneling or a direct tunneling across the silicon dioxide film and then trapped into interfacial energy states serving as trap center on an interface between the silicon dioxide film and the silicon nitride film. During application of zero voltage to the gate, the trapped electrons incline to be accumulated on the interface of the silicon dioxide and silicon nitride films. This represents "1" in logic states and the write operation was completed.

In the erasing operation, a negative voltage is applied to the gate so that the electrons accumulated on the interface between the above two films may show a reverse direction Fowler-Nordheim tunneling or a reverse direction direct tunneling across the silicon dioxide film into the semiconductor substrate thereby the electrons have emitted from the interface between the above oxide and nitride films. This represents "0" in the logic states and the erasing operation was completed.

It may depend upon a thickness of the silicon dioxide film whether the Fowler-Nordheim tunneling or the direct tunneling appears. If the thickness of the silicon dioxide film is larger than 50 angstroms, the Fowler-Nordheim tunneling appears. By contrast, if the thickness of the silicon dioxide film is smaller than 50 angstroms preferably smaller than 30 angstroms, the direct tunneling appears.

The majority of electrons appears to reside on or near to the interface between the two dielectric layers, or the silicon dioxide film and the silicon nitride film. Notwithstanding, the minority of the electrons appears to penetrate into the silicon nitride film by hopping along the bulk traps. It is hard to emit, in the erasing operation by applying an available electric field, electrons having once penetrated into the silicon nitride film. By contrast, it is relatively easy to emit electrons trapped in the interfacial traps on the interface between the silicon dioxide and silicon nitride films.

The existence, after the erase operation, of electrons in the silicon nitride film may cause an unnecessary electric field under which energy band profiles with respect to the metal-nitride-oxide-semiconductor layers are slightly deformed. Needless to say, such unnecessary electric field caused by the electrons existing in the silicon nitride film is left after the erasure operation. In a subsequent write operation, fresh electrons are further captured in the interfacial traps on the interface between the silicon oxide and nitride films to be accumulated therein for signal storage. Even when no voltage is applied to the gate for a long-time storage, such the unnecessary electric field caused by the electrons having existed in the silicon nitride film after the previous erasing operation may, however, allow some electrons to be emitted from the interfacial traps through the reverse direction tunneling process with a low probability. Namely, the electrons trapped in the interfacial traps may show gradual emission through the reverse direction tunneling across the silicon oxide film. This means that a considerable amount of electrons may be emitted from the interfacial traps for such a very long time as required, for example, $10^5$ hours. This renders it hard to trap the informational electrons on the interface between the silicon oxide and nitride films or to achieve a long time storage of informations.

It depends upon a thickness of the silicon dioxide film whether it is easy to prevent electrons trapped in the interfacial traps from being emitted therefrom via the reverse direction tunneling process during no voltage application to the gate for the memory storage. Needless to say, a larger thickness of the silicon dioxide film is preferable in order to secure a prevention of the electrons from any emission. Such large thickness of the silicon dioxide film may, however, act as a bar to the write and erasing operations so as to reduce a probability of the tunneling across the silicon dioxide film under a certain electric field applied. This accords to the principal that increase of a potential barrier width results in a reduction of a probability of tunneling of carriers across the potential barrier under a given electric field. A probability of Fowler-Nordheim tunneling which appears across the thick insulation film is lower than a direct tunneling. inclines appearing across the thin insulation film. When considering each of the Fowler-Nordheim tunneling or the direct tunneling separately, the increase of the width of the insulator or dielectric film results in a reduction of the probability of the each tunneling process.

The reduction of the probability of the tunneling of electrons across the silicon dioxide film may further provide a reduction of a performance speed or result in an increase in time for write and erase operations.

The necessary increase of a low probability of tunneling for realizing the available memory device requires higher voltage applications for the write and erase operations. Such higher voltage applications are undesirable in view of a large power consumption. The thick silicon dioxide film may therefore provide the problem as described above.

By contrast, the use of a thin silicon dioxide film may be free from the above problem with the large voltage applications and the large power consumption. This is, however, engaged with the other problem with difficulty in securing such a long time memory storage as required, for example, $10^5$ hours as described above.

There has been known in the art another conventional memory device modified from the above metal-nitride-oxide-semiconductor memory device. The another conventional memory device has three dielectric films between the channel region and the gate electrode so that electrons may be accumulated in an intermediate dielectric film among the three films. This conventional device is disclosed in the Japanese Patent Publication No. 62-33753, a structure thereof is illustrated in FIG. 1, referring to which this device will be described.

Field oxide films 102 are formed on a main face of a silicon substrate 101 to define an active region for transistor. Source and drain regions are formed by impurity diffusions to define a channel region on which the following three dielectric films acting as gate insulators are formed. A bottom silicon oxide film 105 having a thickness of 2.5 to 5 nanometers is formed on the channel region by a thermal oxidation of silicon. An intermediate film 106a made of either silicon nitride or aluminium oxide containing metal atoms such as tungsten is formed on the bottom film 105. The intermediate film has a thickness of 1 to 5 nanometers. A top film 106 made of either silicon nitride or aluminium oxide and having a thickness of 35 to 70 nanometers is formed on the intermediate film 106a. A gate electrode 107 is formed on the top film 106. The gate electrode may comprise a polysilicon film doped with an n-type dopant or an aluminium film. An inter-layer insulator 108 is formed on an entire of the processed surface of the device for subsequent formations of contact holes over the source and drain regions respectively. Source and drain electrodes 109 and 110 are formed to contact to the source and drain regions respectively through the contact holes.

In the write operation, a positive voltage is applied to the gate electrode 107 to cause electrons on the channel region to show a tunneling through the bottom silicon oxide film 105 into the intermediate film 106a in which the electrons having tunneled are accumulated.

In the erase operation, either a negative voltage is applied to the gate electrode 107 or a positive voltage is applied to the silicon substrate 101 to cause the electrons accumulated in the intermediate film 106a to tunnel through the bottom silicon oxide film 105 into the channel region of the silicon substrate 101 for emission of the electrons.

The above conventional device as illustrated in FIG. 1 has the following different feature than the normal two layered gate insulator metal-nitride-oxide-semiconductor memory devices as described above. The gate insulator includes the intermediate film 106a into which electrons are accumulated for memory storage. The intermediate film 106a may contain metal atoms or metal particles uniformly distributed, which may serve as trap centers for electrons. Namely, the intermediate film 106a has a large number of center traps uniformly distributed, for which reason almost all electrons are trapped thereinto. This may present electrons from penetrating into the top film 106, although it is hard to emit the electrons having once penetrated into the top film 106.

As described above, in the normal metal-nitride-oxide-semiconductor memory device, the majority of electrons are trapped into the interfacial trap centers on the interface between the oxide and nitride films, while the minority of electrons incline to penetrate into the nitride film. It is hard to emit the electrons having once penetrated into the nitride film.

The intermediate film 106a having a large number of center traps into which electrons may readily trapped prevents any accumulation of electrons in the top nitride or aluminium oxide film. This may facilitate the erasure operation. The necessary time for either write or erasing operation is reduced to approximately 1 microseconds. The write and erasing operations comes into 10 to $10^4$ times as fast as the above normal devices.

The bottom oxide film having the thickness of 2.5 nanometer or more may allow a long time memory storage or may prevent electron emission via electron tunneling through the bottom silicon oxide film into the silicon substrate 101. A possible time for the memory storages comes into $10^5$ hours which is 10 to $10^3$ times as longer as the normal device.

This conventional memory device illustrated in FIG. 1, however, has two serious problems, one of which is concerned with a high voltage application and another is concerned with a pollution of semiconductor by metal atoms.

The conventional device of FIG. 1 requires a highly voltage application more than 30 V for write and erase operations. This voltage level is considerably higher than voltages 5 V and 12 V as required by the floating gate memory transistor. However, the above normal metal-nitride-oxide-semiconductor memory device also needs such high voltage application as 30 V. In consideration of a hard and earnest requirement for a possible reduction of the voltage to be applied to the gate or for a possible reduction of the power consumption, such a high voltage as approximately 30 V should be reduced considerably at least into 5 V or less.

As described above, the intermediate film 106 has a large number of metal atoms or metal particles acting as the traps for electrons. Such metal atoms or metal particles are mixed into the intermediate film 106a. This may provide a certain possibility of pollution by metal to the silicon substrate. This may results in considerable deteriorations of device performances or device qualities.

From the foregoing descriptions, it may be understood that there has not been any non-volatile memory device free from any problems as described above and a development of such desirable memory device has acutely been required for realizing larger capacity non-volatile memory cells.

SUMMARY OF THE INVENTION

Accordingly, it is an object of the present invention to provide a non-volatile memory device having a metal-insulator-semiconductor gate structure, the device being able to show excellent performances and possesses desirable properties free from any problems as described above.

It is a further object of the present invention to provide a non-volatile memory device having a metal-insulator-semiconductor gate structure, the device being able to show write and erase operations by applying a low voltage to a gate.

It is a furthermore object of the present invention to provide a non-volatile memory device having a metal-insulator-semiconductor gate structure, the device being able to show write and erase operations with a reduced power consumption.

It is a still further object of the present invention to provide a non-volatile memory device having a metal-insulator-semiconductor gate structure, the device being able to show write and erase operations with a low power consumption.

It is yet a further object of the present invention to provide a non-volatile memory device having a metal-insulator-semiconductor gate structure, the device being able to show write and erase operations with a low power consumption.

It is a moreover object of the present invention to provide a non-volatile memory device having a metal-insulator-semiconductor gate structure, the device being available to show write and erase operations a great number of times.

It is another object of the present invention to provide a non-volatile memory device having a metal-insulator-semiconductor gate structure, the device being able to show a long time memory storage.

It is still another object of the present invention to provide a non-volatile memory device having a metal-insulator-semiconductor gate structure, the device being able to show high speed write and erasure operations.

It is yet another object of the present invention to provide a non-volatile memory device having a metal-insulator-semiconductor gate structure free from any deterioration in semiconductor quality and property due to pollution of metal.

The above and other objects, features and advantages of the present invention will be apparent from the following descriptions.

The present invention provides a multilayer structure comprising a semiconductor layer, a first insulating layer being formed on the semiconductor layer and having a first dielectric constant $\epsilon_1$ and having a first thickness of $t_1$, a second insulating layer being formed on the first insulating layer and having a second dielectric constant $\epsilon_2$ and having a second thickness of $t_2$, and a highly conductive layer formed on the second insulating layer, wherein the first and second dielectric constants $\epsilon_1$ and $\epsilon_2$ and the first and second thicknesses $t_1$ and $t_2$ satisfy the conditions of $20 \leq \epsilon_2/\epsilon_1$, and $t_2/t_1 \leq \epsilon_2/\epsilon_1$. When an electric field is applied between the semiconductor and highly conductive layers, electrons exhibit a direct tunneling across the first insulating layer. The electrons having exhibited the direct tunneling from the semiconductor layer are trapped into interfacial states on an interface between the first and second insulating layers.

The present invention also provides a metal-insulator-semiconductor gate insulating structure involved in a non-volatile memory device showing write-erase operations. The gate insulating structure comprises a semiconductor substrate, a first insulating layer being formed on the semiconductor substrate and having a first dielectric constant $\epsilon_1$ and having a first thickness of $t_1$, a second insulating layer being formed on the first insulating layer and having a second dielectric constant $\epsilon_2$ and having a second thickness of $t_2$, and a gate electrode of a metal layer formed on the second insulating layer, wherein the first and second dielectric constants $\epsilon_1$ and $\epsilon_2$ and the first and second thicknesses $t_1$ and $t_2$ satisfy the conditions of $20 \leq \epsilon_2/\epsilon_1$, and $t_2/t_1 \leq \epsilon_2/\epsilon_1$. When a voltage is applied between the gate electrode and the semiconductor substrate, electrons exhibit a direct tunneling across the first insulating layer for the write-erase operations. The electrons having exhibited the direct tunneling from the semiconductor substrate are trapped into interfacial states on an interface between the first and second insulating layers.

The present invention also provides a non-volatile semiconductor memory transistor having a metal-insulator-semiconductor gate insulating structure showing write-erase operations. The transistor comprises a semiconductor substrate, source and drain regions formed on a surface of the semiconductor substrate, a channel region defined between the source and drain regions on the surface of the semiconductor substrate, a first gate insulating layer being formed on the channel region and having a first dielectric constant $\epsilon_1$ and having a first thickness of $t_1$, a second gate insulating layer being formed on the first gate insulating layer and having a second dielectric constant $\epsilon_2$ and having a second thickness of $t_2$, and a gate electrode of a metal layer formed on the second gate insulating layer, wherein the first and second dielectric constants $\epsilon_1$ and $\epsilon_2$ and the first and second thicknesses $t_1$ and $t_2$ satisfy the conditions of $20 \leq \epsilon_2/\epsilon_1$, and $t_2/t_1 \leq \epsilon_2/\epsilon_1$. When a voltage is applied between the gate electrode and the semiconductor substrate, electrons exhibit a direct tunneling across the first gate insulating layer for the write-erase operations. The electrons having exhibited the direct tunneling from the channel region are trapped into interfacial States on an interface between the first and second gate insulating layers.

The second insulating layer may preferably comprise either strontium titanium oxide, barium strontium titanate, lead zirconia titanate, bismuth titanate, or bismuth strontium tantalate.

The second insulating layer may comprise a solid solution of at least two different materials which compositions are so varied that an energy band gap is gradually and continuously increased in a direction toward the gate electrode from the first insulating layer.

The second insulating layer may comprise a solid solution of at least two different materials which compositions are so varied that an energy band gap is gradually increased with step-like discontinuities in a direction toward the gate electrode from the first insulating layer.

There may further be provided a third insulating layer between the second insulating layer and the metal layer. The third insulating layer has a smaller dielectric constant and a larger energy band gap than those of the second dielectric layer. The third insulating layer may be made of, for example, tantalum oxide.

There may further be provided semiconductor particles being so distributed as spaced apart from each other on the interface between the first and second insulating layers. The semiconductor particles may have diameters approximately equal to or less than a thickness of a five-atomic layer. The semiconductor particle may comprise silicon atoms.

The first insulating layer may comprise either silicon oxide, silicon nitride or a silicon oxide layer containing nitrogen atoms.

The gate electrode comprises a metal selected from the group consisting of titanium nitride, ruthenate, palladium and platinum.

The first thickness $t_1$ of the first insulating layer is in the range from 2.5 nanometers to 5 nanometers.

The second thickness $t_2$ of the second insulating layer is in the range from 50 nanometers to 100 nanometers.

BRIEF DESCRIPTIONS OF THE DRAWINGS

Preferred embodiments of the present invention will hereinafter fully be described in detail with reference to the accompanying drawings.

FIG. 9 is a fragmentary cross sectional elevation view illustrative of a novel metal-insulator-semiconductor non-volatile memory transistor in a fourth embodiment according to the present invention.

FIG. 10 is an energy band diagram associated with a metal-insulator-semiconductor gate structure involved in a novel non-volatile memory transistor in a fourth embodiment according to the present invention.

FIG. 13 is an energy band diagram associated with a metal-insulator-semiconductor gate structure involved in a novel non-volatile memory transistor in a fifth embodiment according to the present invention.

DESCRIPTIONS OF THE INVENTION

Figure 2B:
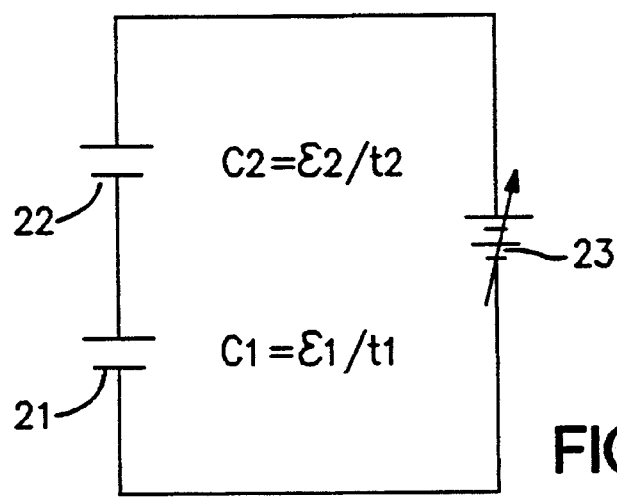
FIG. 2B is a circuit diagram illustrative of an equivalent circuit associated with a metal-insulator-semiconductor multi-layer structure of FIG. 2A.
Figure 2A:
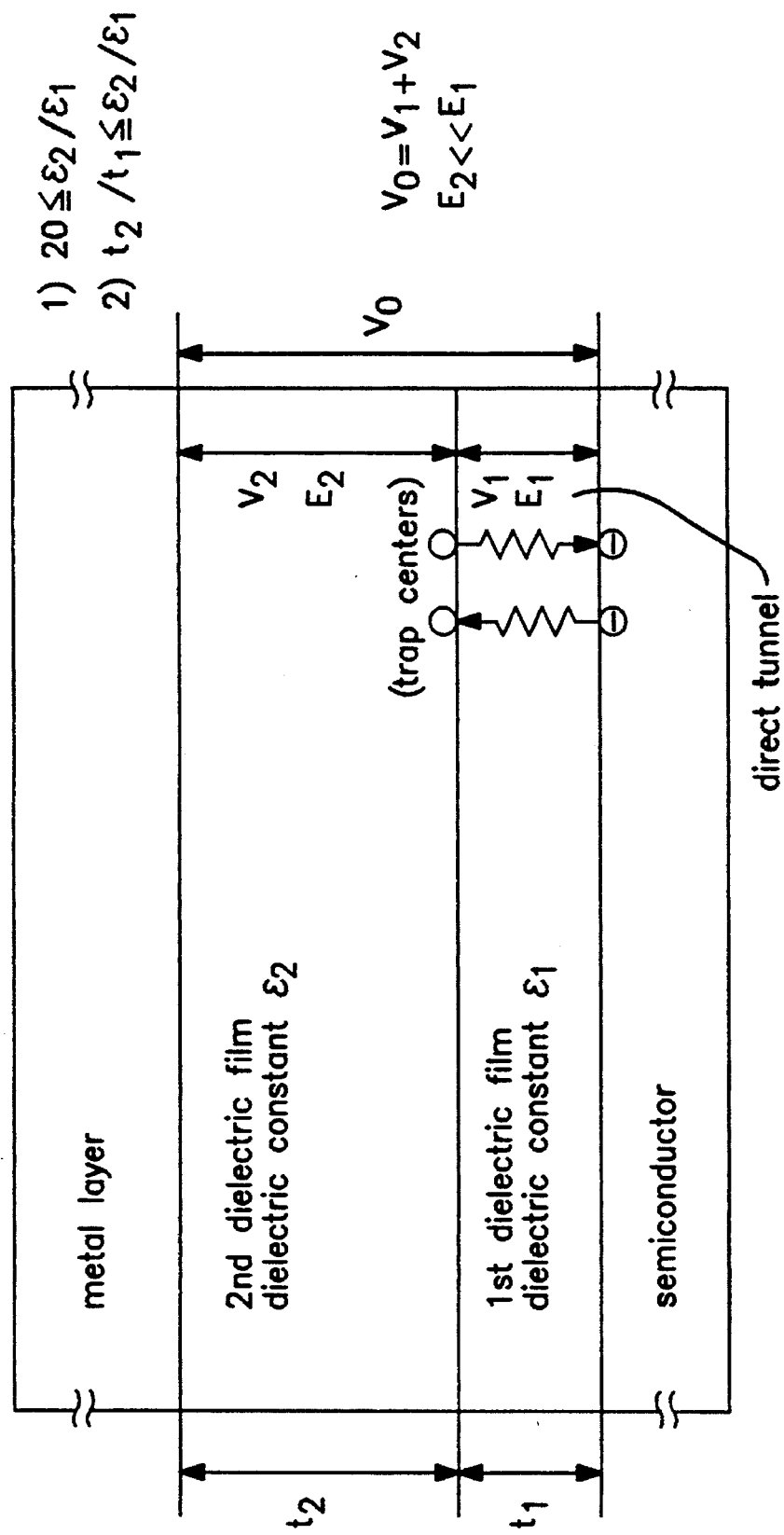
FIG. 2A is a view illustrative of a feature of the present invention provided by a novel metal-insulator-semiconductor multi-layer structure.

The present invention provides a non-volatile memory device having an improved metal-insulator-semiconductor multilayer gate structure including two insulating films made of different materials as illustrated in FIG. 2A. A first insulating film is formed on a semiconductor substrate and a second insulation film is formed on the first insulation film. A metal layer or a highly conductive layer serving as a gate electrode is formed on the second insulation film.

In write and erasure operations, positive and negative voltage signals are respectively applied to the gate electrode to apply an electric field across the multi-layer structure to cause electrons to exhibit a direct tunneling across the first insulator film.

In the write operation, a positive voltage signal may be applied to the gate electrode to cause electrons to show a direct tunnel from a surface of the semiconductor substrate through the first insulating film onto an interface between the first and second insulating films and then the electrons having exhibited this direct tunneling are trapped into interfacial trap centers or at interfacial energy states for a term during which no voltage is applied to the gate electrode or no electrical field is applied across the multi-layer structure in order to keep the electrons trapped into the interfacial traps for memory storage. Such accumulation of electrons on the interface between the first and second insulating films may represent "1" in the binary states.

In the erase operation, either a negative voltage is applied to the gate electrode or a positive voltage is applied to the semiconductor substrate to thereby cause the electrons to show a direct tunneling in reverse direction from the interfacial traps through the first insulating film into the semiconductor substrate so as to emit the electrons from the interface of the first and second insulating films. No or almost no electron existing on the interface between the first and second insulating films may represent "0" in the binary states.

It is an essential feature of the present invention that the first and second insulation films respectively have first and second dielectric constants different one another as well as first and second thicknesses different one another, wherein the second dielectric constant is sufficiently larger than the first dielectric constant and the first thickness is sufficiently smaller than the second thickness so that even if a relatively low voltage, for example, 5 V or less is applied to the gate electrode, a sufficiently high electric field is applied to the first insulating film for allowing electrons to exhibit the direct tunneling across the first insulating film for the write and erasure operations with a low voltage application.

For the first and second insulating films, different dielectric materials with the first and second dielectric constants $\epsilon_1$ and $\epsilon_2$ should be selected to satisfy the condition of $20 \leq \epsilon_1/\epsilon_2$. The first and second thicknesses $t_1$ and $t_2$ should be determined to satisfy the condition of $t_2/t_1 \leq \epsilon_2/\epsilon_1$. Those conditions for the dielectric constants and the thicknesses associated with the first and second insulation films would be essential to achieve the above-described objects of the present invention.

The second insulating layer may be made of dielectrics having sufficiently large dielectric constants such as strontium titanium oxide, barium strontium titanate, lead zirconia titanate, bismuth titanate and bismuth strontium tantalate.

By contrast, the first insulating layer may be made of dielectric materials having sufficiently smaller dielectric constants than those of the second insulating film. Silicon oxide, silicon nitride or a silicon oxide layer containing nitrogen atoms are available as the dielectric material of the first insulating film.

For the first and second insulating films, any combinations in use of the above first and second dielectric materials selected from the above two groups respectively are available provided that the above condition of $20 \leq \epsilon_2/\epsilon_1$ be satisfied.

Further, dielectric materials other than the above described materials for the first and second insulating films are available, provided that the above condition for the first and second dielectric constants of the first and second insulating films be satisfied.

The first thickness $t_1$ of the first insulating layer may be in the range from 2.5 nanometers to 5 nanometers and the second thickness $t_2$ of the second insulating layer may be in the range from 50 nanometers to 100 nanometers. The first and second thicknesses $t_1$ and $t_2$ of the first and second insulating films are determined to satisfy the above condition of $t_2/t_1 \leq \epsilon_2/\epsilon_1$.

The above two conditions with respect to the dielectric constants $\epsilon_1$ and $\epsilon_2$ and the thicknesses $t_1$ and $t_2$ are essential feature of the present invention. As described above, the second dielectric constant $\epsilon_2$ of the second dielectric film is sufficiently larger than the first dielectric constant $\epsilon_1$ so that a large part of the voltage applied to the gate electrode may be distributed to the first insulating film. Further, the first thickness $t_1$ of the first insulating film is sufficiently smaller than the second thickness $t_2$ of the second insulating film so that a much higher electric field is applied across the first insulating film than an electric field applied across the second insulating film. According to the above two conditions of the dielectric constants and the thicknesses with respect to the first and second insulating films, even if a low voltage is applied to the gate electrode, a sufficiently high electric field is applied across the first insulating film for allowing electrons to exhibit at a high probability the direct tunneling across the first insulating film in the write and erase operations.

The following descriptions will focus on how the above two conditions are introduced and determined. As described above and illustrated in FIG. 2, the first and second insulating films are in turn laminated on the semiconductor substrate. The metal layer or the highly conductive layer serving as the electrode overlays the second insulating film. Such multi-layer lamination structures may be regarded as constituting an equivalent circuit as illustrated in FIG. 2B wherein two capacitors 21 and 22 having different capacities $C_1$ and $C_2$ per unit area respectively are connected in series to a DC power supply 23 which may supply variable DC voltages. The first and second dielectric constants $\epsilon_1$ and $\epsilon_2$ may be given as the product of the first and second capacities C1 and C2 per unit area and the first and second thicknesses $t_1$ and $t_2$ of the first and second dielectric films respectively, namely the equations of $C_1=\epsilon_1/t_1$, $C_2=\epsilon_2/t_2$. The variable DC power supply 23 may be regarded as a gate electrode receiving positive and negative voltage signals.

The novel multi-layer structure according to the present invention is designed to allow a long time memory storage, for example, $1 \times 10^5$ hours or longer, namely to allow electrons serving as informational charges to be trapped for that long time in the interfacial traps on the interface between the first and second dielectric films. To achieve this long time memory storage, it is required to make a possible reduction of the probability of the direct tunneling of electrons in reverse direction from the interfacial trap centers through the first dielectric film into the semiconductor layer under no or almost no electric field application. The probability of the reverse direction direct tunneling of electrons inclines to depend upon the first thickness $t_1$ of the first dielectric film serving as a potential barrier to the electrons. A reduction of the probability of the reverse direction direct tunneling of electrons under no electric field application to the multi-layer structure requires an increase of the first thickness $t_1$ of the first dielectric film across which the direct tunneling of electrons may appear at a low probability. Notwithstanding, in view of the write and erasure operations, a possible reduction in thickness of the first dielectric film is required. To satisfy the above two opposed requirements for thickness of the first dielectric film, it could be found that the minimum thickness of the first dielectric film would be 2.5 nanometers. At least this thickness is required to realize the electron storage for $1\times10^5$ hours or longer in the interfacial traps on the interface between the first and second dielectric films under no or almost no electric field.

As described above, the above minimum thickness 2.5 nanometers of the first dielectric film is introduced according to the requirement for the memory storage for $1\times10^5$ hours or longer. It could be further confirmed that $1\times10^7$ V/cm be the necessary intensity of the electric field applied across the first dielectric film in order to cause the direct tunneling of electrons across the first dielectric film having the thickness of 2.5 nanometers. Accordingly, it can be understood from the above conditions that 2.5 V or higher introduced by the product of the thickness 2.5 nanometers and the electric field of $1\times10^7$ V/cm would be the necessary voltage to be applied across the first dielectric film.

As described above, the most important one of the objects of the present invention is to realize the write and erasure operations by applying a low voltage such as 5 V or less to the metal layer in view of a considerable reduction of the power consumption. Assuming that 5 V is applied to the metal layer, at least 2.5 V is required to be applied across the first dielectric film. At least a half or more of the voltage applied to the metal layer has to be distributed to the first dielectric film. Namely, the voltage ratio $V_1/V_0$ has to be 0.5 or more wherein $V_0$ represents a voltage applied to the metal layer or the gate electrode and the voltage $V_0$ is divided into voltages $V_1$ and $V_2$ applied across the first and second films respectively.

In the meantime, from the equivalent circuit of FIG. 2B, it could be understood that the voltages $V_1$ and $V_2$ may be given by the following two equations.

$$V_1=V_0C_2/(C_1+C_2)=V_0/((t_2/t_1)/(\epsilon_2/\epsilon_1)+1) \quad (1)$$

$$V_2=V_0C_1/(C_1+C_2)=V_0/((t_1/t_2)/(\epsilon_1/\epsilon_2)+1) \quad (2)$$

From both the above essential condition that $V_1/V_0$ is 0.5 or above and the equation (1), the condition for the first and second thicknesses $t_1$ and $t_2$ and the first and second dielectric constants $\epsilon_1$ and $\epsilon_2$ may be introduced as follows.

$$t_2/t_1 \leq \epsilon_2/\epsilon_1$$

where $\epsilon_1$ and $\epsilon_2$ are the dielectric constants of the first and second dielectric films and $t_1$ and $t_2$ are the thicknesses of the first and second dielectric films.

As having been described, the above equation $t_2/t_1 \leq \epsilon_2/\epsilon_1$ is introduced under the desired conditions for the low voltage application at not more than 5 V for the reduced power consumption and for 2.5 nanometers as the minimum value in the thickness $t_1$ of the first dielectric film.

As the first thickness $t_1$ of the first dielectric film has the desired value, the second thickness $t_2$ of the second dielectric film has to be subject to a restriction as follows. The second thickness $t_2$ of the second dielectric film is required to be sufficient for keeping any tunneling processes of electrons from appearing across the second dielectric film. Not only the direct tunneling of electrons but also the Fowler-Nordheim tunneling thereof have to be prevented by a large thickness of the second dielectric film. The probability of the tunneling of the electrons across the second dielectric film depends upon the thickness $t_2$ of the second dielectric film. A possible reduction of the tunneling probability of electrons would, accordingly, be required. From this viewpoint, there would be required a possible large thickness $t_2$ of the second dielectric film.

Meanwhile, the thickness $t_2$ of the second dielectric film is needed to satisfy the equation $t_2/t_1 \leq \epsilon_2/\epsilon_1$, wherein the first thickness $t_1$ is desired to be just or near 2.5 nanometers in order to satisfy the above two opposed conditions for allowing the long time memory storage for at least $1\times10^5$ hours and allowing the direct tunneling of electrons at a high probability. In view of obtaining large degrees of freedom with respect to the first and second dielectric constants $\epsilon_1$ and $\epsilon_2$, there would be required a smaller thickness $t_2$ of the second dielectric film. Accordingly, the second thickness $t_2$ of the second dielectric film is subjected to the opposed requirements. It could, however, be found that 50 nanometers in the thickness of the second dielectric film would be the minimum to satisfy the above opposed requirements with respect to the second thickness $t_2$ provided that the thickness $t_1$ of the first dielectric film takes the best value 2.5 nanometers, form which it may be introduced that the ratio in thickness of the second to first dielectric films or $t_2/t_1=20$. Notwithstanding, the thickness ratio $t_2/t_1$ more than 20 would be preferable to ensure a large degree of freedom of the second thickness $t_2$ of the second dielectric film.

In consideration of satisfying the equation $t_2/t_1 \leq \epsilon_2/\epsilon_1$ and ensuring a possible large degree of freedom of each of the first and second thicknesses $t_1$ and $t_2$, the ratio in the dielectric constant of the second dielectric film to the first dielectric film would be at least 20, namely be equal to or more than 20. This may be represented as follows.

$$20 \leq \epsilon_2/\epsilon_1$$

where $\epsilon_1$ and $\epsilon_2$ are the first and second dielectric constants.

Dielectric constants of silicon dioxide and silicon nitride available as a material for the first dielectric film are 3.9 and 6.0 respectively. A dielectric constant of the silicon oxide film including nitrogen atoms being also available for the first dielectric film is an intermediate value between 3.9 and 6.0.

By contrast, the above described dielectrics available for the second dielectric film must have much higher dielectric constants individually. For example, dielectric constants of strontium titanium oxide, barium strontium titanate and bismuth titanate are approximately 200, 510 and 100 respectively. The other materials have also such high dielectric constants as satisfying the equation of $20 \leq \epsilon_2/\epsilon_1$.

The second insulating film may comprise a single dielectric material selected from the groups of strontium titanium oxide, barium strontium titanate, lead zirconia titanate, tantalum pantaoxide, bismuth titanate and bismuth strontium tantalate.

To further facilitate the prevention of the direct tunneling of electrons from appearing across the second dielectric film, it is available that the second dielectric comprises a plurality of materials and which compositions are varied as follows.

The second insulating layer may comprise a solid solution of at least two different materials selected from the above groups wherein compositions of the selected materials are so varied that an energy band gap is gradually and continuously increased in a direction toward the gate electrode from the first insulating layer. For example, there is available barium strontium titanate in solid solution of two compositions of strontium titanium oxide and barium titanate wherein the ratio of the compositions is varied in a direction toward the gate electrode from the first insulating layer to case a slop of the energy band gap across the second dielectric film. The energy band gap is increased in the direction toward the metal layer from the first dielectric film.

This may render it difficult that electrons accumulated in the interfacial trap centers on the interface between the first and second dielectric films show the tunneling across the second dielectric film. This may result in an increase of a memory storage, during which almost all the electrons having injected onto the interface between the first and second dielectric films may be kept in residing at the interfacial traps. Such energy band slop may also cause an internal electric field which may further localize the electron trap centers onto the interface between the first and second dielectric films. This further localization of the electron trap centers may lead to a further reduction of the necessary time for write or erase operation.

Alternatively, the second insulating layer may comprise a solid solution of at least two different materials selected from the above group wherein compositions of the selected materials are so varied that an energy band gap is gradually increased with step-like discontinuities in a direction toward the gate electrode from the first insulating layer. For example, there is available barium strontium titanate in solid solution of two compositions of strontium titanium oxide and barium titanate wherein the ratio of the compositions is varied in a direction toward the gate electrode from the first insulating layer to cause a step-like slop of the energy band gap across the second dielectric film. The energy band gap has a step-like increase in the direction toward the metal layer from the first dielectric film.

This may render it difficult that electrons accumulated in the interfacial trap centers on the interface between the first and second dielectric films show the tunneling across the second dielectric film. This may result in an increase in the time for a memory storage, during which almost all the electrons having injected onto the interface between the first and second dielectric films may be kept in residing at the interfacial traps. Such energy band gap increase may also cause an internal electric field which may localize the electron trap centers onto the interface between the first and second dielectric films. This localization of the electron trap centers may lead to a reduction of the necessary time for write or erase operation.

Alternatively, there may further be provided a third insulating layer between the second insulating layer and the metal layer. The third insulating layer has a smaller dielectric constant and a larger energy band gap than those of the second dielectric layer. The third insulating layer may be made of, for example, tantalum oxide.

This may render it difficult that electrons accumulated in the interfacial trap centers on the interface between the first and second dielectric films show the tunneling across the second dielectric film. This may result in an increase in the time for a memory storage, during which almost all the electrons having injected onto the interface between the first and second dielectric films may be kept in residing at the interfacial traps. Such energy band gap increase may also cause an internal electric field which may localize the electron trap centers onto the interface between the first and second dielectric films. This localization of the electron trap centers may lead to a reduction of the necessary time for write or erase operation.

By the way, the electrons accumulated in the interfacial traps on the interface between the first and second dielectric films may provide an affection to the threshold voltage with respect to the direct tunneling of electrons for the write and erase operations. There is a difference in the threshold voltage between after the write operation and after the erase operation. The difference $\Delta V$ in the threshold voltage is given by the following equation.

$$\Delta V = qN/C_2 = qt_2 N/\epsilon_2 \quad (3)$$

where q is the charge element and N is the number of trapped electrons per unit area as well as $t_2$ and $\epsilon_2$ are the thickness and dielectric constant of the second dielectric film. The range in the variation of the threshold voltage is required to be kept constant regardless of the values of $t_2$ and $\epsilon_2$. As described above, the second dielectric film has a high dielectric constant $\epsilon_2$. The increase of the dielectric constant of the second dielectric film requires an increase of the number of the captured electrons at the trap centers provided that the thickness of the second dielectric film is kept constant. The increase of the number of electrons captured or trapped at the trap centers requires an increase of the number of interfacial trap centers on the interface between the first and second dielectric films.

In order to achieve the increase of the number of interfacial trap centers for electrons, it may be available to further provide semiconductor particles or semiconductor cores on the interface of the first and second insulating films wherein the particles or cores are so distributed as spaced apart one another but as closely as possible one another wherein the semiconductor particles or cores may serve as trap centers for electrons. Namely, the semiconductor particles or cores are available to capture or trap electrons having exhibited the direct tunneling from the semiconductor substrate through the first insulating film onto the interface between the first and second insulating films. The semiconductor particles or cores may have diameters approximately equal to or less than a thickness of a five-atomic layer to allow the particles or cores to be so distributed as spaced apart from each other but as closely as possible one another. The semiconductor particle may comprise silicon atoms. The metal layer comprises a metal selected from the group consisting of titanium nitride, ruthenate, palladium and platinum. Other metals which may be used for electrodes or contacts are also available. Further, in place of the metal layer, there may be also available a highly conductive material such as an impurity doped polysilicon film.

PREFERRED EMBODIMENTS

A first embodiment according to the present invention will be described below in which there is provided a novel non-volatile memory transistor having an improved metal-insulator-semiconductor multi-layer structure, a feature of which have been described above.

Figure 3:
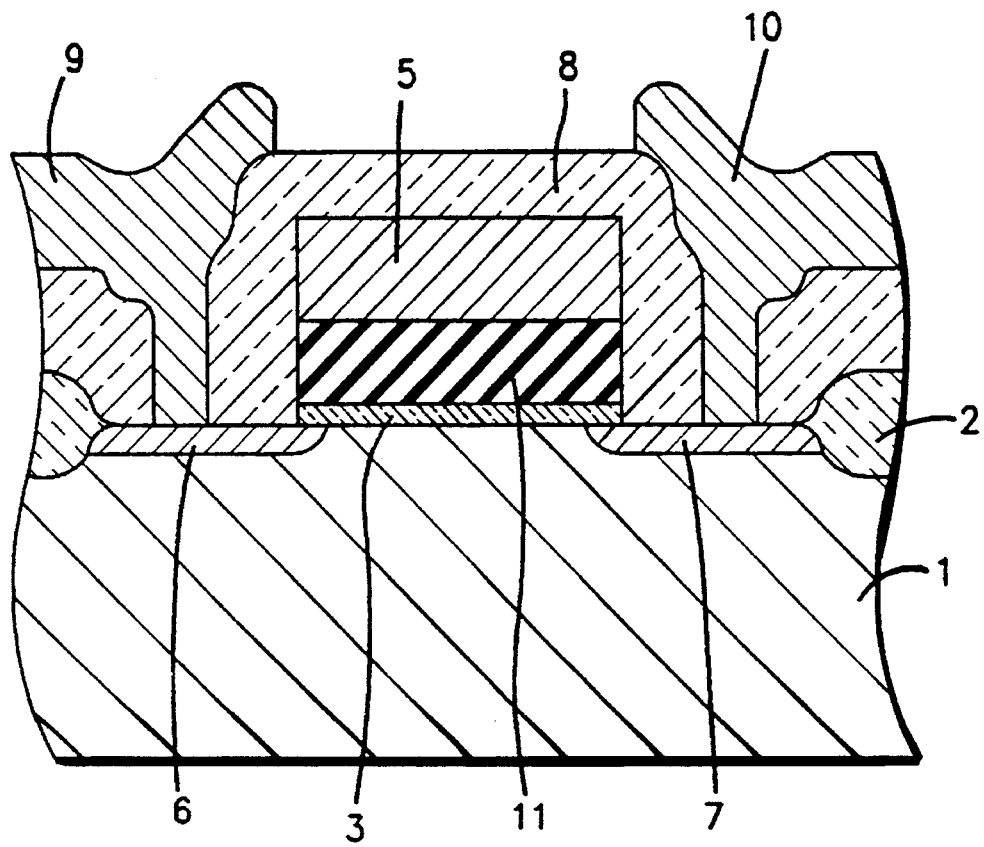
FIG. 3 is a fragmentary cross sectional elevation view illustrative of a novel metal-insulator-semiconductor non-volatile memory transistor in a first embodiment according to the present invention.

FIG. 3 illustrates a novel non-volatile semiconductor memory transistor having a metal-insulator-semiconductor gate structure. A substrate comprises a p-type silicon substrate 1. Field oxide films 2 serving as an electrical isolation of the transistor from other devices are selectively formed on a main face of the p-type silicon substrate 1 so that an active region on which a transistor is formed is defined. A first dielectric film 3 having a thickness in the range of from 2.5 nanometers to 5 nanometers on the main face in the active region of the silicon substrate 1. The first dielectric film 3 comprises a silicon oxide film or a silicon oxide film including nitrogen atoms wherein nitrogen atoms are introduced into the silicon oxide film by a thermal nitration. The first dielectric film is formed after removal of a spontaneous oxide film from the main face of the silicon substrate 1 and cleaning the main face of the silicon substrate 1.

A second dielectric film 11 is formed on the first dielectric film 3 where a thickness thereof is ranged from 50 to 100 nanometers. The second dielectric film is made of any one selected from dielectric materials having much higher dielectric constant than the dielectric constants of the silicon oxide film and the silicon oxide film including nitrogen atoms. As materials for the second dielectric film, there may, for example, be available strontium titanium oxide, barium strontium titanate, lead zirconia titanate, bismuth titanate or bismuth strontium tantalate.

A gate electrode 4 comprising a metal layer having a thickness of approximately 200 nanometers is formed on the second dielectric film 11. As the metal layer of the gate electrode, there may be available titanium nitride, ruthenate, palladium and platinum.

Source and drain regions 6 and 7 comprising $n^+$-type diffusion regions are formed by ion-implantation of arsenic and subsequent heat treatment by a lump annealing for diffusion of the implanted arsenic atoms. It is important that the heat treatment is carried out at a possible low temperature to prevent any deterioration of electrical properties of the second dielectric film 11, particularly insulating property. An inter-layer insulator 8 having a thickness of 500 nanometers is formed on an entire of the device. The inter-layer insulator may comprise either a silicon oxide film including boron phosphate silicate glass or a silicon dioxide film. Contact holes are formed in the inter-layer insulator 8 for formation of source and drain electrodes 9 and 10 which are made contact to the source and drain regions 6 and 7 through the contact holes thereby the fabrication of the transistor illustrated in FIG. 3 is completed.

Figure 4:
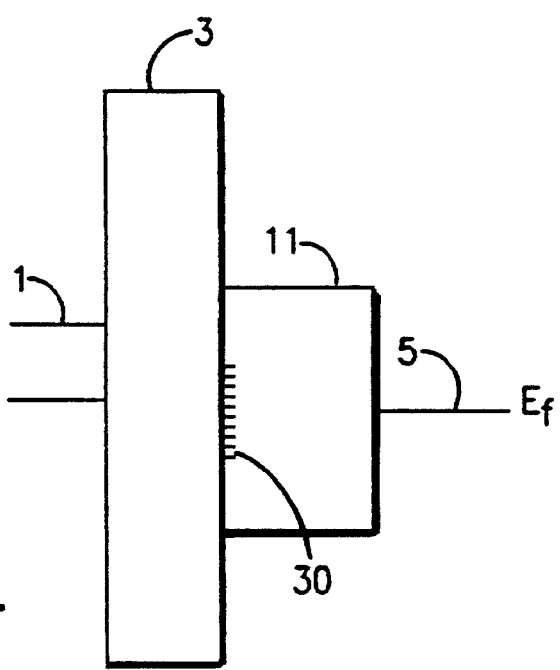
FIG. 4 is an energy band diagram associated with a metal-insulator-semiconductor gate structure involved in a novel non-volatile memory transistor in a first embodiment according to the present invention.

FIG. 4 illustrates an energy band gap profile across the metal-insulator-semiconductor multi-layer gate structure of the novel non-volatile semiconductor memory device illustrated in FIG. 3. In the write operation, by applying a positive voltage to the gate electrode 5, an electric field is applied across the multi-layer structure so that electrons on the conduction band associated with the silicon substrate 1 comes to show the direct tunneling at a relatively high probability through a potential barrier associated with the first dielectric film 3 having the largest energy band gap into interfacial trap centers 30 on the interface between the first and second dielectric films 3 and 11. The interfacial traps to electrons are represented by a plurality of short line segments. Those segments represent the range in which the electrons having tunneled incline to reside, or the range of a distribution with respect to the existential probability of electrons. From FIG. 4, it could be understood that electrons are distributed on and extremely near position to the interface between the firsts and second dielectric films.

Not only the first dielectric film 3 serves as a potential barrier to electrons but also the second dielectric film 11 may also serve as a potential barrier to electrons although an energy band gap of the second dielectric film 11 is smaller than an energy band gap of the first dielectric film 3. The second dielectric film 11 has a sufficient larger thickness for preventing electrons at the interfacial traps 30 from showing any tunneling through the potential barrier associated with the second dielectric film 11 into a Fermi level $E_f$ associated with the gate electrode 5.

In the erase operation, either a negative voltage is applied to the gate electrode 5 or a positive voltage is applied to the silicon substrate 1 so that the electrons in the interfacial trap centers comes to show the direct tunneling at a relatively high probability in the reverse direction through the potential barrier associate with the first dielectric film 3 to the conduction band associated with the silicon substrate 1.

The above novel non-volatile semiconductor memory device was subjected to operational tests in the write and erase operations and in the memory storage time under comparing to the prior art of the metal-nitride-oxide-semiconductor non-volatile memory transistor.

The tests were carried out under the conditions as follows. The thicknesses $t_1$ and $t_2$ of the first and second dielectric films 3 and 11 are 2.5 nanometers and 50 nanometers respectively. A variation $\Delta V$ in the threshold voltage between after the write and erase operations is 4 V. A comparative reference voltage in read out operation is 2 V. There were measured write and erase voltages to be applied to the gate electrode in the write and erase operations respectively, and also times necessary for the write and erase operations respectively. Further, a time of the memory storage was measured. Results of the measurements of the above factors are illustrated in TABLE 1.

TABLE 1

| 2nd Dielectric | Invention | | | Prior Art |
| --- | --- | --- | --- | --- |
|  | TO | STO | BST | $Si_3N_4$ |
| Write Voltage (V) | 11 | 3.5 | 2.9 | 33 |
| Write Time (μsec) | 1.5 | 5 | 7 | 1 |
| Erase Voltage (V) | −11 | −3.5 | −2.9 | −33 |
| Erase Time (μsec) | 2.5 | 7 | 10 | 2 |
| Storage Time (hr) | $10^5$ | $10^5$ | $10^5$ | $10^5$ | where "TO" represents a titanium oxide film, "STO" represents a strontium titanium oxide, and "BST" represents barium strontium titanate.

From TABLE 1, it could be understood that when strontium titanium oxide or barium strontium titanate is used for the second dielectric film, the necessary write and erasure voltages would be less than 5 V. By contrast, when silicon nitride film is used for the second dielectric film, 33 V is necessary. The storage time is not changed between the invention and the prior art. The term $1\times 10^5$ hours is sufficient for actual use of the memory device. Whereas the write and erasure times of the invention are somewhat larger than the times of the prior art, such values are not problem to use the transistor as a flash memory. The necessary times for the write and erase operations of the floating gate memory transistor are respectively 10 microseconds and 1 millisecond.

Figure 1:
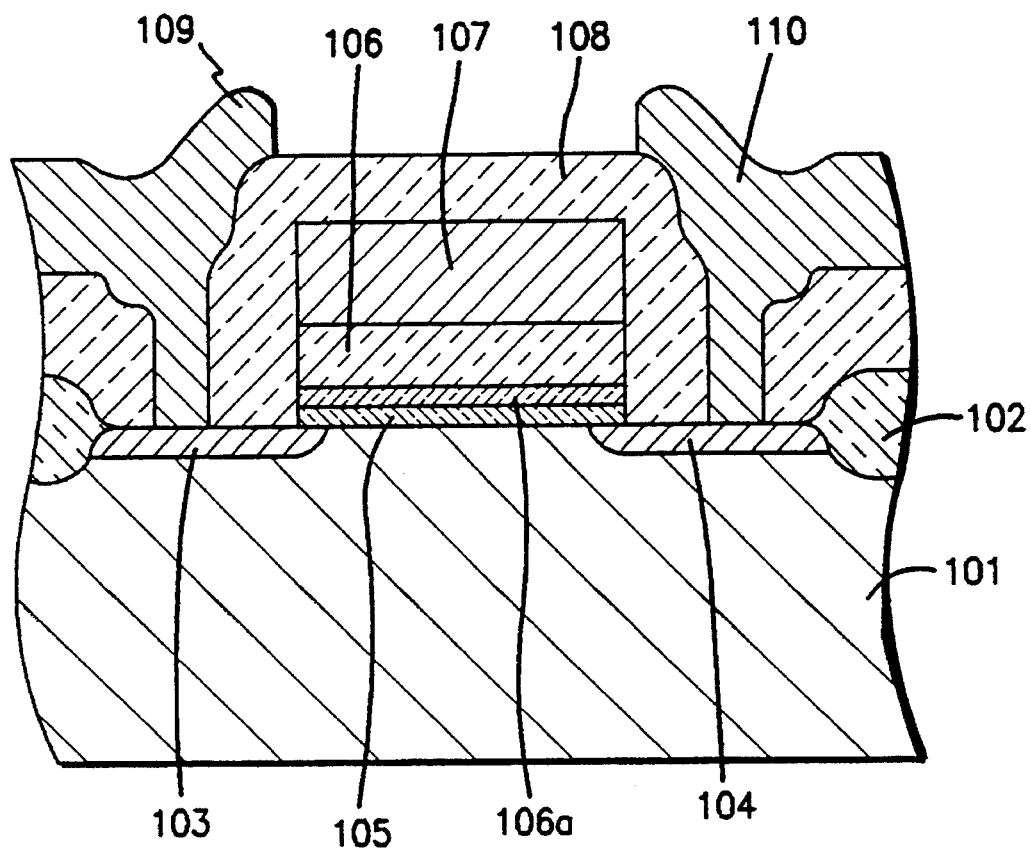
FIG. 1 is a fragmentary cross sectional elevation view illustrative of the conventional metal-nitride-oxide-semiconductor non-volatile memory transistor.

According to the present invention, metal atoms in the second dielectric film have chemical bonds, while metal atoms in the intermediate layer of the conventional transistor illustrated in FIG. 1 have no chemical bond. The novel non-volatile memory transistor is free from the problem with the deterioration in semiconductor quality and property due to pollution of metal.

As compared to the floating gate memory transistor, the present invention have improvements in the reduction of the erasure voltage into one fourth and in the shortening of the write and erasure times respectively into one hundredth and into one ten-thousandth and also improvements in an increase of a possible number of time for the write and erase operations up to a thousand times. The device properties and performances are rapidly improved.

A second embodiment according to the present invention will be described below in which there is provided a novel non-volatile memory transistor having an improved metal-insulator-semiconductor multi-layer structure, a feature of which have been described above.

Figure 5:
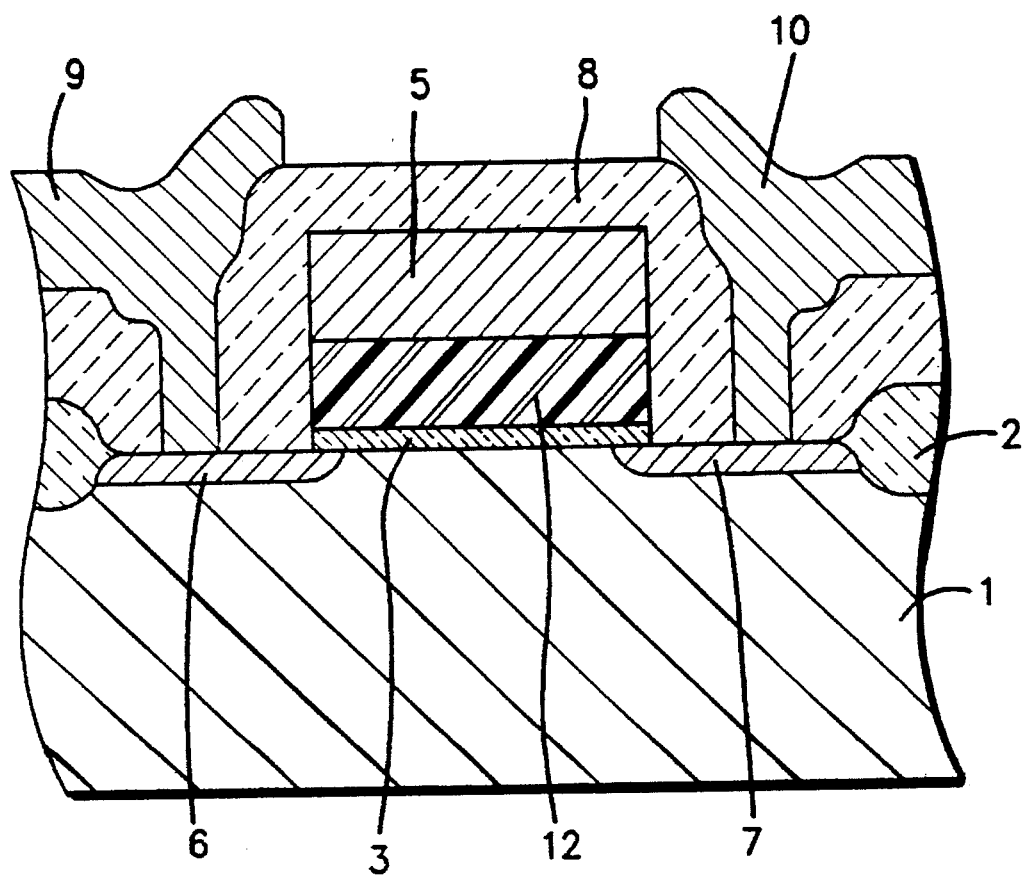
FIG. 5 is a fragmentary cross sectional elevation view illustrative of a novel metal-insulator-semiconductor non-volatile memory transistor in a second embodiment according to the present invention.

FIG. 5 illustrates a novel non-volatile semiconductor memory transistor having a metal-insulator-semiconductor gate structure. A structural difference between the first and second embodiments is in the second dielectric film only. Any other parts of the transistors are the same one another.

To prevent the duplicate descriptions, the following description will focus on the second dielectric film only.

The second insulating layer may comprise barium strontium titanate in solid solution of two compositions of strontium titanium oxide and barium titanate wherein the ratio of the compositions is varied in a direction toward the gate electrode from the first insulating layer. Compositions of strontium titanium oxide and barium titanate are so varied that an energy band gap is gradually increased with a smooth slop in a direction toward the gate electrode 5 from the first dielectric film 3.

This may render it difficult that electrons accumulated in the interfacial trap centers 30 on the interface between the first and second dielectric films 3 and 12 show the tunneling across the second dielectric film 12. This may result in an increase of a memory storage, during which almost all the electrons having injected onto the interface between the first and second dielectric films may be kept in residing at the interfacial traps. Such energy band slop may also cause an internal electric field which may localize the electron trap centers onto the interface between the first and second dielectric films. This localization of the electron trap centers may lead to a further reduction of the necessary time for write or erase operation.

The second dielectric film 12 made of barium strontium titanate in solid solution of two compositions of strontium titanium oxide and barium titanate and having the varied compositions thereof may be grown either by a chemical vapor deposition or by sputtering. The chemical vapor deposition method is selected in this second embodiment.

A structure of an apparatus for growing the second dielectric film 12 is similar to the apparatus used for growing a boron phosphate silicate glass film. The apparatus used for growing the second dielectric film 12 is provided with a reaction tube made of quartz. There is further provided a low pressure chemical vapor deposition furnace for heating up the reaction tube and a feeder for introducing a source gas into the furnace in addition pipelines for the gas feeding. A temperature of the furnace is set in the range from 600° C. to 700° C. Meanwhile, $Ti(i-OC_3H_7)_4$ is introduced in a quartz vessel or a stainless vessel to be then kept at a temperature of approximately 20° C. for future use as a source material of titanium. Further, $Sr(DPM)_2$ in powder states is introduced into a stainless vessel to be heated up to a temperature of approximately 190° C. for future use as a material for strontium, where "DPM" represents CH(CO—$C(CH_3)_3)_2$. Moreover, $Ba(DPM)_2$ in powder states is introduced into a stainless vessel to be heated up to a temperature of approximately 210° C. for future use as a material for strontium, where "DPM" represents CH(CO—$C(CH_3)_3)_2$. Those carrier gases are introduced by Argon gas serving as a carrier gas through the pipe lines into the furnace where the pipe lines are kept at a temperature of approximately 220° C. to prevent any dewing or any solidification of the reaction gases. The introduction of the reaction gases into the furnace follows a previous mixing of the reaction gases. The mixture of the reaction gases is carried out within a stainless cylinder which is kept at a temperature of approximately 230° C. At this time, an oxygen gas and nitrogen suboxide are also introduced together with the introduction of the reaction gases. It is preferable to design the pipe lines to shorten the length of the pipe lines.

Pressures of the gases are kept at approximately 1 Torr during a deposition of the second dielectric film of barium strontium titanate in the apparatus for growing the second dielectric film. A gas flow rate of $Ti(i-OC_3H_7)_4$ serving as a source gas of titanium is kept constant, while gas flow rates of $Sr(DPM)_2$ and $Ba(DPM)_2$ are continuously varied as time passes so that compositionnally modified (Ba, Sr)$TiO_3$ film is grown where a growth rate of the film is approximately 1 nanometer per minute. The flow rate of the carrier gas for $Ti(i-OC_3H_7)_4$ is kept at 70 sccm, while the flow rate of the carrier gas for $Sr(DPM)_2$ is increased from 0 sccm up to 300 sccm and also the flow rate of the carrier gas for $Ba(DPM)_2$ is but reduced from 70 sccm to 0 sccm as the time passes so that the compositions are changed from barium titanate to strontium titanium oxide. The increase of the flow rate of the carrier gas for $Sr(DPM)_2$ and the reduction of the flow rate of the carrier gas for $Ba(DPM)_2$ are continuously carried out to form the smoothly sloped energy band gap variation as illustrated in FIG. 6.

Figure 6:
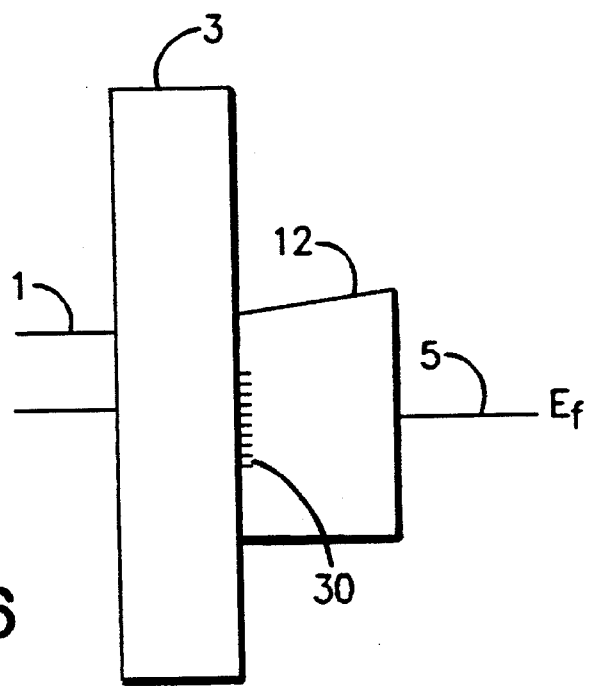
FIG. 6 is an energy band diagram associated with a metal-insulator-semiconductor gate structure involved in a novel non-volatile memory transistor in a second embodiment according to the present invention.

FIG. 6 illustrates a band gap profile across the multi-layer laminations comprising a platinum layer 5, a barium strontium titanate (Ba, Sr)$TiO_3$ film 12, a silicon dioxide $SiO_2$ film 3 and a silicon substrate 1. An energy band gap of silicon is 1.15 eV. An energy band gap of silicon dioxide is 8 eV. An energy band gap of barium titanate is 3 eV. An energy band gap of strontium titanium oxide is 3.4 eV. Then, an energy band gap of the barium strontium titanate (Ba, Sr)$TiO_3$ film 12 is increased from 3 eV from 3.4 eV smoothly and linearly toward the platinum gate electrode 5.

This may render it difficult that electrons accumulated in the interfacial trap centers 30 on the interface between the first and second dielectric films 3 and 12 show the tunneling across the second dielectric film 12. This may result in an increase of a memory storage time up to two times, as compared to the device of the first embodiment, during which almost all the electrons having injected onto the interface between the first and second dielectric films may be kept in residing at the interfacial traps. Such energy band slop may also cause an internal electric field which may localize the electron trap centers onto the interface between the first and second dielectric films. This localization of the electron trap centers may lead to a further reduction of the necessary time for write or erase operation down to one fifth or less.

A third embodiment according to the present invention will be described below in which there is provided a novel non-volatile memory transistor having an improved metal-insulator-semiconductor multi-layer structure, a feature of which have been described above.

Figure 7:
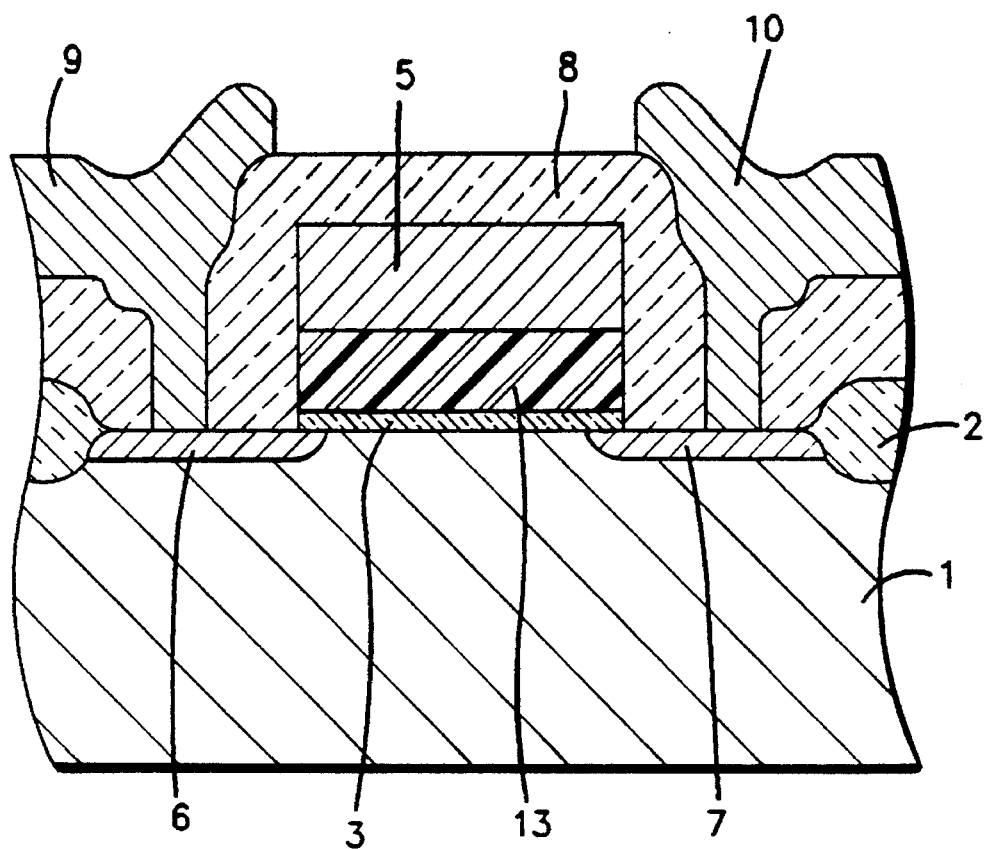
FIG. 7 is a fragmentary cross sectional elevation view illustrative of a novel metal-insulator-semiconductor non-volatile memory transistor in a third embodiment according to the present invention.

FIG. 7 illustrates a novel non-volatile semiconductor memory transistor having a metal-insulator-semiconductor gate structure. A structural difference between the first and third embodiments is in the second dielectric film only. Any other parts of the transistors are the same one another. To prevent the duplicate descriptions, the following description will focus on the second dielectric film only.

The second insulating layer may comprise barium strontium titanate in solid solution of two compositions of strontium titanium oxide and barium titanate wherein the ratio of the compositions is varied in a direction toward the gate electrode from the first insulating layer. Compositions of strontium titanium oxide and barium titanate are so varied that an energy band gap is gradually increased with a step-like discontinuity in a direction toward the gate electrode 5 from the first dielectric film 3.

This may render it difficult that electrons accumulated in the interfacial trap centers 30 on the interface between the first and second dielectric films 3 and 13 show the tunneling across the second dielectric film 13. This may result in an increase of a memory storage, during which almost all the electrons having injected onto the interface between the first and second dielectric films may be kept in residing at the interfacial traps. Such energy band gap step-like variation may also cause an internal electric field which may localize the electron trap centers onto the interface between the first and second dielectric films. This localization of the electron trap centers may lead to a further reduction of the necessary time for write or erase operation.

The second dielectric film 13 made of barium strontium titanate in solid solution of two compositions of strontium titanium oxide and barium titanate and having the varied compositions thereof may be grown either by a chemical vapor deposition or by sputtering. The chemical vapor deposition method is selected in this third embodiment.

For growing the second dielectric film 13, the same apparatus as the second embodiment may be used. The descriptions of the apparatus will therefore be omitted. A temperature of the furnace is set in the range from 600° C. to 700° C. Meanwhile, $Ti(i-OC_3H_7)_4$ is introduced in a quartz vessel or a stainless vessel to be then kept at a temperature of approximately 20° C. for future use as a source material of titanium. Further, $Sr(DPM)_2$ in powder states is introduced into a stainless vessel to be heated up to a temperature of approximately 190° C. for future use as a material for strontium, where "DPM" represents $CH(CO-C(CH_3)_3)_2$. Moreover, $Ba(DPM)_2$ in powder states is introduced into a stainless vessel to be heated up to a temperature of approximately 210° C. for future use as a material for strontium, where "DPM" represents $CH(CO-C(CH_3)_3)_2$. Those carrier gases are introduced by Argon gas serving as a carrier gas through the pipe lines into the furnace where the pipe lines are kept at a temperature of approximately 220° C. to prevent any dewing or any solidification of the reaction gases. The introduction of the reaction gases into the furnace follows a previous mixing of the reaction gases. The mixture of the reaction gases is carried out within a stainless cylinder which is kept at a temperature of approximately 230° C. At this time, an oxygen gas and nitrogen suboxide are also introduced together with the introduction of the reaction gases.

Pressures of the gases are kept at approximately 1 Torr during a deposition of the second dielectric film of barium strontium titanate in the apparatus for growing the second dielectric film. A gas flow rate of $Ti(i-OC_3H_7)_4$ serving as a source gas of titanium is kept constant, while gas flow rates of $Sr(DPM)_2$ and $Ba(DPM)_2$ are discontinuously varied at time intervals so that a compositionnally modified (Ba, Sr)$TiO_3$ film is grown where a growth rate of the film is approximately 1 nanometer per minute. The flow rate of the carrier gas for $Ti(i-OC_3H_7)_4$ is kept at 70 sccm, while the flow rate of the carrier gas for $Sr(DPM)_2$ is subjected to a step-like increase from 0 sccm up to 300 sccm and also the flow rate of the carrier gas for $Ba(DPM)_2$ is subjected to a step-like reduction from 70 sccm to 0 sccm respectively as the time passes so that the composition has a step-like change from barium titanate to strontium titanium oxide. The step-like increase of the flow rate of the carrier gas for $Sr(DPM)_2$ and the step-like reduction of the flow rate of the carrier gas for $Ba(DPM)_2$ are carried out to form the step-like energy band gap variation as illustrated in FIG. 8.

Figure 8:
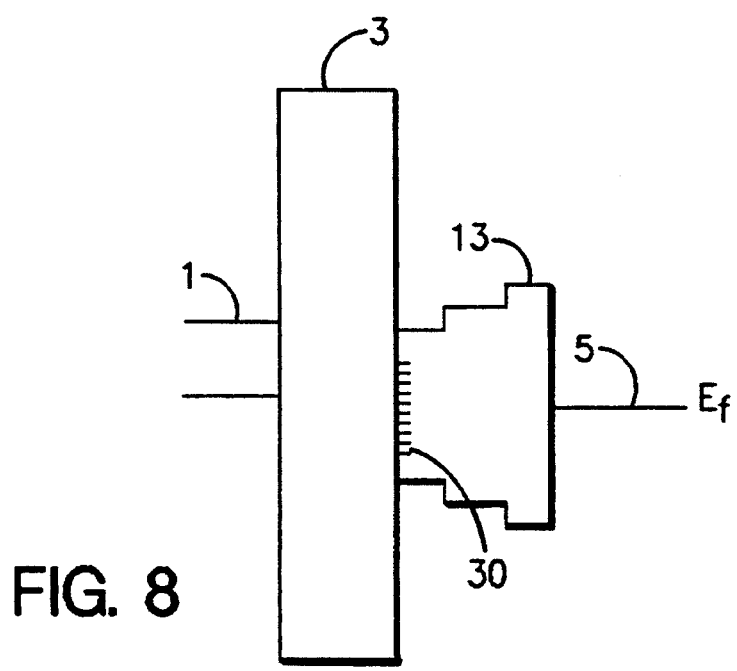
FIG. 8 is an energy band diagram associated with a metal-insulator-semiconductor gate structure involved in a novel non-volatile memory transistor in a third embodiment according to the present invention.

FIG. 8 illustrates a band gap profile across the multi-layer laminations comprising a platinum layer 5, a barium strontium titanate (Ba, Sr)$TiO_3$ film 13, a silicon dioxide $SiO_2$ film 3 and a silicon substrate 1. An energy band gap of silicon is 1.15 eV. An energy band gap of silicon dioxide is 8 eV. An energy band gap of barium titanate is 3 eV. An energy band gap of strontium titanium oxide is 3.4 eV. An energy band gap of the barium strontium titanate (Ba, Sr)$TiO_3$ film 13 is increased from 3 eV from 3.4 eV with step-like discontinuities in a direction toward the platinum gate electrode 5.

This may render it difficult that electrons accumulated in the interfacial trap centers 30 on the interface between the first and second dielectric films 3 and 13 show the tunneling across the second dielectric film 13. This may result in an increase of a memory storage time up to two times, as compared to the device of the first embodiment, during which almost all the electrons having injected onto the interface between the first and second dielectric films may be kept in residing at the interfacial traps. Such energy band slop may also cause an internal electric field which may localize the electron trap centers onto the interface between the first and second dielectric films. This localization of the electron trap centers may lead to a further reduction of the necessary time for write or erase operation down to one fifth or less.

A fourth embodiment according to the present invention will be described below in which there is provided a novel non-volatile memory transistor having an improved metal-insulator-semiconductor multi-layer structure, a feature of which have been described above.

FIG. 9 illustrates a novel non-volatile semiconductor memory transistor having a metal-insulator-semiconductor gate structure. A structural difference between the first and fourth embodiments is only in providing a third dielectric film between the second dielectric film and the gate electrode. Any other parts of the transistors are the same one another. To prevent the duplicate descriptions, the following description will focus on the second and third dielectric films only.

The second and third insulating layers may comprise laminations of different two dielectric films 14a and 14b. The second dielectric film 14a is made of barium strontium titanate. The second dielectric film 14a has a thickness of 30 nanometers and is formed on the silicon substrate 1. The third dielectric film 14b is made of tantalum oxide and has a thickness of 20 nanometers. Since tantalum oxide has a larger energy band gap than an energy band gap of barium strontium titanate, the third dielectric film 14b has a larger energy band gap than an energy band gap of the second dielectric film 14a as illustrated in FIG. 10.

This may render it difficult that electrons accumulated in the interfacial trap centers 30 on the interface between the first dielectric film 3 and the dielectric film 14a show the tunneling across the second dielectric films 14a and 14b. This may result in an increase of a memory storage, during which almost all the electrons having injected onto the interface between the first and second dielectric films may be kept in residing at the interfacial traps. Such energy band gap variation may also cause an internal electric field which may localize the electron trap centers onto the interface between the first and second dielectric films. This localization of the electron trap centers may lead to a further reduction of the necessary time for write or erase operation.

The second dielectric film 14a may be grown either by a chemical vapor deposition or by sputtering. The chemical vapor deposition method is selected in this fourth embodiment. For growing the second dielectric film 14a, the same apparatus as the second embodiment may be used. The descriptions of the apparatus will therefore be omitted. A temperature of the furnace is set in the range from 600° C. to 700° C. Meanwhile, $Ti(i-OC_3H_7)_4$ is introduced in a quartz vessel or a stainless vessel to be then kept at a temperature of approximately 20° C. Further, $Sr(DPM)_2$ in powder states is introduced into a stainless vessel to be heated up to a temperature of approximately 190° C., where "DPM" represents $CH(CO—C(CH_3)_3)_2$. Moreover, $Ba(DPM)_2$ in powder states is introduced into a stainless vessel to be heated up to a temperature of approximately 210° C. Those carrier gases are introduced by Argon gas serving as a carrier gas through the pipe lines into the furnace. The introduction of the reaction gases into the furnace follows a previous mixing of the reaction gases. The mixture of the reaction gases is carried out within a stainless cylinder which is kept at a temperature of approximately 230° C. At this time, oxygen gas and nitrogen suboxide are also introduced together with the introduction of the reaction gases.

Pressures of the gases are kept at approximately 1 Torr during a deposition of the second dielectric film 14a of barium strontium titanate. A gas flow rate of $Ti(i-OC_3H_7)_4$ serving as a source gas of titanium is kept constant, and also gas flow rates of $Sr(DPM)_2$ and $Ba(DPM)_2$ are kept in constant.

For a subsequent growth of the tantalum oxide third dielectric film 14b, $Ta(OC_2H_5)_5$ and $O_2$ are introduced as the reaction gases into the reduced pressure chemical vapor deposition furnace. A deposition temperature is set in the range from 400° C. to 500° C. Alternatively, it is available to use $TaCl_5$ gas and $N_2O$ gas in plasma states for the deposition of the tantalum oxide film.

This may render it difficult that electrons accumulated in the interfacial trap centers 30 on the interface between the first and second dielectric films 3 and 14a show the tunneling across the second dielectric film 14a. This may result in an increase of a memory storage time up to two times or more, as compared to the device of the first embodiment, during which almost all the electrons having injected onto the interface between the first and second dielectric films may be kept in residing at the interfacial traps. Such energy band gap variation by providing the third dielectric film 14b of the large energy band gap may also cause an internal electric field which may localize the electron trap centers onto the interface between the first and second dielectric films. This localization of the electron trap centers may lead to a further reduction of the necessary time for write or erase operation down to one fifth or less. The necessary voltages for the write and erase operations are ranged from 5 V to 7 V.

A fifth embodiment according to the present invention will be described below in which there is provided a novel non-volatile memory transistor having an improved metal-insulator-semiconductor multi-layer structure, a feature of which have been described above.

Figure 11:
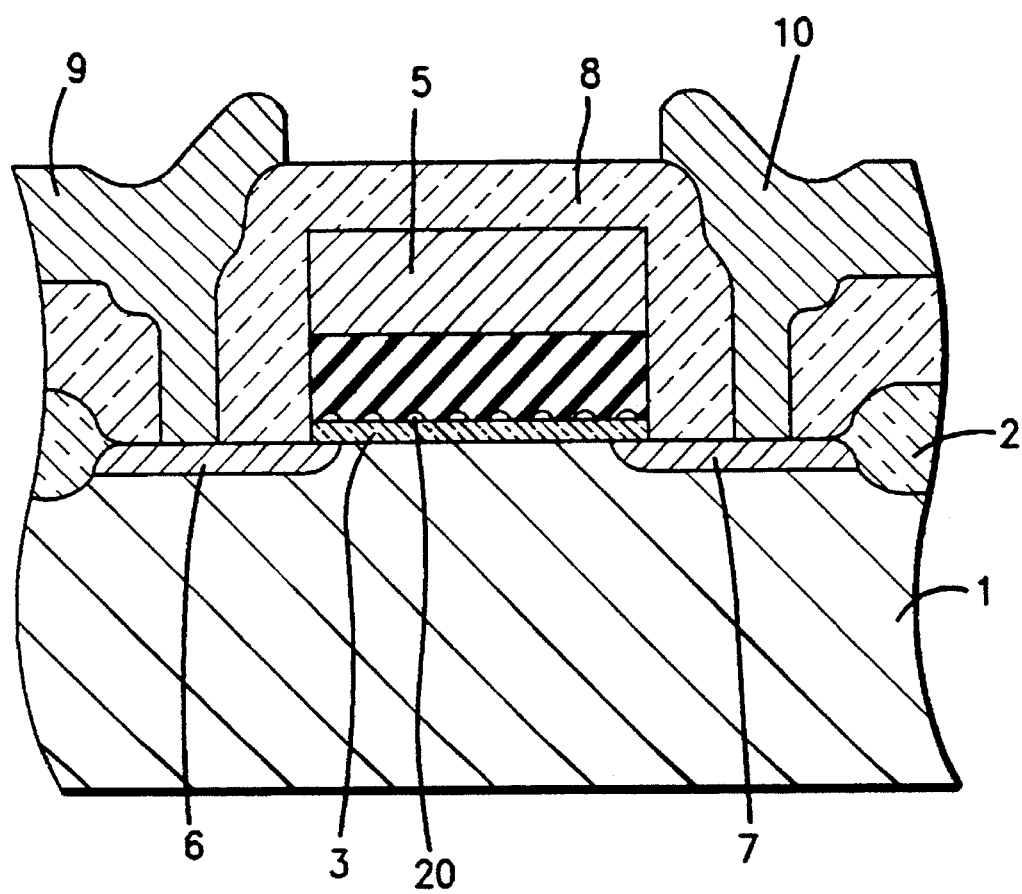
FIG. 11 is a fragmentary cross sectional elevation view illustrative of a novel metal-insulator-semiconductor non-volatile memory transistor in a fifth embodiment according to the present invention.

FIG. 11 illustrates a novel non-volatile semiconductor memory transistor having a metal-insulator-semiconductor gate structure. A structural difference between the first and fifth embodiments is in further providing silicon particles 20 as many as possible on the interface between the first and second dielectric films 3 and 15. The silicon particles 20 are so distributed as being spaced apart one another but as closely as possible.

The first dielectric film 3 is formed on a predetermined region of the silicon substrate 1. The first dielectric film 3 is the same film as that of the first embodiment, for example, a silicon oxide film or a silicon oxide film subjected to a thermal nitridation. The thickness of the first dielectric film is ranged from 2.5 nanometers to 3 nanometers. Whereas the second dielectric film 15 may be the same film as any of those of the first, second and third embodiments, in this embodiment the second dielectric film 15 comprises a strontium titanium oxide film having a thickness of 50 nanometers.

The silicon particles 20 may comprise fine powders of monocrystal silicon having diameters not more than a thickness of the first dielectric film 3.

Figure 12:
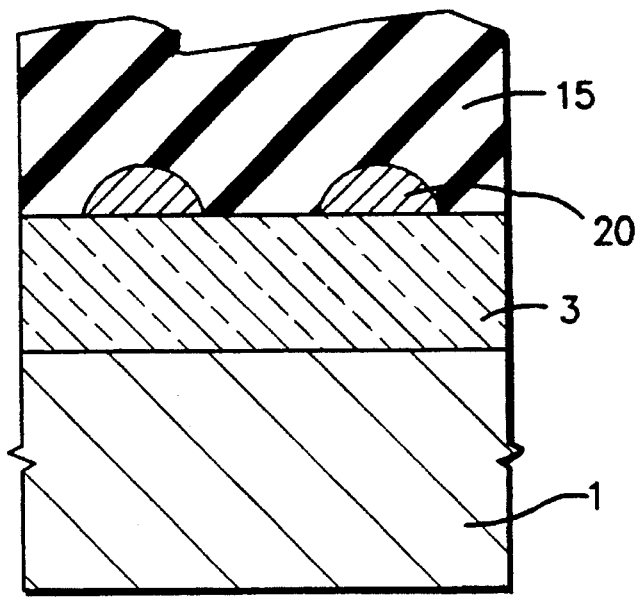
FIG. 12 is a fragmentary enlargement view of a metal-insulator-semiconductor gate structure of FIG. 11.

Alternatively, the silicon particles 20 may comprise silicon clusters having diameters in particles not more than 1 nanometers. It may also be available to have the silicon fine particles 20 contain an impurity such as boron, phosphate or arsenic atoms, provided that an impurity concentration is limited within $1 \times 10^{20}$ to $1 \times 10^{21}$ atoms/cm$^3$ to keep silicon fine particles 20 in a solid solution The silicon particles 20 have hemispherical shapes and the second dielectric film 15 so covers the silicon particles 20 and the first dielectric film 3 as to form no aperture between those as illustrated in FIG. 12.

As described above, the increase of the dielectric constant of the second dielectric film 15 requires an increase of the number of the captured electrons at the trap centers to keep within a predetermined range the variation in the threshold voltage of the transistor between after the write operation and after the erase operation. The increase of the number of electrons captured or trapped at the trap centers requires an increase of the number of interfacial trap centers on the interface between the first and second dielectric films 3 and 15.

In order to achieve the increase of the number of interfacial trap centers for electrons, the silicon particles provide many electron trap centers being available to capture or trap electrons injected onto the interface between the first and second dielectric films via the direct tunneling. A large number of the electron trap centers exist on both an interface between the silicon particles 20 and the first dielectric film 3 and an interface between the silicon particles 20 and the second dielectric film 15. By contrast, a smaller number of the electron trap centers exist on an interface between the first and second dielectric films. Accordingly, the electrons accumulated on the interface between the first and second dielectric films incline to be localized within the silicon particles 20. If the silicon particles 20 are distributed in a large distance, there is a problem in an electrical discontinuity of the informational electrons. A remarkable electrical discontinuity on the interface between the first and second dielectric films 3 and 15 may provide an undesirable affection to the surface of the silicon substrate 1 thereby resulting in a deterioration of the performances and properties of the non-volatile memory transistor. To prevent this problem, it is required that the silicon particles 20 are distributed as closely as possible at a distance nearly equal to or less than the diameters of the silicon particles 20.

FIG. 13 illustrates an energy band gap profile across the multi-layers comprising the silicon substrate 1, the first and second dielectric films and the silicon particles as well as the gate electrode. An energy band gap 45 is associated with the silicon substrate 1. An energy band gap 41 is associated with the first dielectric film 3. An energy band gap 42 is associated with the second dielectric film 15. An energy band gap 43 is associated with the silicon particles 20. A Fermi level $E_f$ 46 is associated with the metal layer of the gate electrode 5. A plurality of short line segments aligned in two columns are illustrated in the energy band gap area with respect to the silicon particles 20. The line segments horizontally extend from each of two interfaces of the energy band gap 43 to both the energy band gaps 41 and 42 associated with the first and second dielectric films 3 and 15 respectively. The line segments represent interfacial electron trap centers 44 and 44a on the two interfaces of the silicon particles 20 to the first and second dielectric films 3 and 15. In the write operation, by applying a positive voltage to the gate electrode 5, electrons are injected via the direct tunneling into the trap centers 44 and 44a where energy levels of the electrons correspond to interface states. Those segments also represent the range in which the electrons reside or the range of a distribution with respect to the existential probability of electrons. Electrons incline to be distributed on and extremely near to each of the interfaces between the silicon particles and both the first and second dielectric films 3 and 15. Since the size of the size of the silicon particles 20 is not more than 3 nanometers as described above, a region into which the electrons are accumulated is well localized.

The necessary voltages for the write and erase operations are 3 V and −3 V respectively. The necessary time for the write and erase operations is 100 nanoseconds or less. A possible number of time in the write and erase operations is $1 \times 10^7$ to $1 \times 10^8$. A memory storage time is $1 \times 10_5$ hours.

The following description will focus on a novel method for fabricating the non-volatile memory transistor of FIGS. 11 and 12.

Figure 14A:
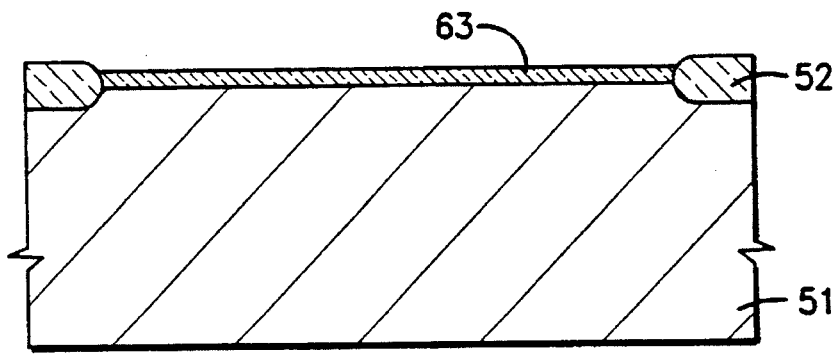
FIGS. 14A through 14F are fragmentary cross sectional elevation views illustrative of sequential processes involved in a novel method for fabricating a novel metal-insulator-semiconductor non-volatile memory transistor similarly to the transistor of FIG. 11 according to the present invention.

With referring to FIG. 14A, field oxide films 52 are formed on a main face of the p-type silicon substrate 1 by use of a local oxidation of silicon (LOCOS) method. After cleaning the main face of the silicon substrate 51, a silicon oxide film 63 having a thickness of 2.5 nanometers to 3 nanometers is formed on the main face of the silicon substrate 51. These cleaning and forming processes are carried out at one time by an apparatus provided with multiple chambers. Alkaline or acid chemical is used to clean the silicon substrate 51 for removal of a spontaneous oxide film and subsequent thermal oxidation to a surface region of the silicon substrate 51 within the above apparatus.

Figure 14B:
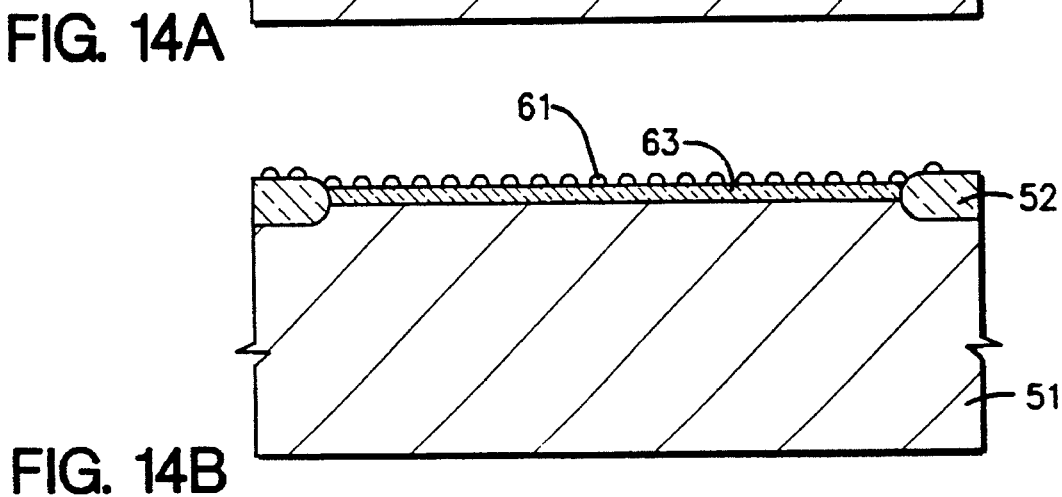

With referring to FIG. 14B, silicon particles 61 are so formed as to be spaced apart one another but as closely as possible, for example, at a distance equal to or less than the diameters of the silicon particles 61. The silicon particles 61 may comprise either fine powders of silicon crystal or silicon clusters. In case of the fine powders of the silicon crystal, the formation processes are as follows. A single wafer chemical vapor deposition apparatus is used wherein a temperature of a reaction chamber is set in the range from 600° to 700° C. and then monosilane gas or dichlorosilane gas is introduced together with a nitrogen carrier gas into the reaction chamber. The total pressure of the introduced gases is kept at approximately 1 mTorr. The above conditions are determined to allow the growth at an extremely small growth rate to form fine powders of silicon crystal. Alternatively, a multiple chamber apparatus may also be used for forming the silicon oxide film 63 and the silicon particles 61 of the fine powders.

In case of the silicon clusters, an apparatus for producing clusters is used where a laser beam is irradiated onto silicon in a solid state under a high vacuum condition not more than $1 \times 10^{-8}$ Torr. The laser beam is an ArF excited dimer laser in pulses. When the excited dimer laser with an intensity equal to or higher than 100 mJ/cm$^2$ is irradiated onto the solid silicon, sublimation of silicon atoms from the solid silicon comes appear so that part of the sublimated silicon atoms shows chemical bonds to entry into a cluster state. The silicon silicon clusters 61 are then deposited on the silicon oxide film 63. A size of the silicon cluster depends upon the intensity of the pulse laser beam. The pulse laser beam irradiation with a large intensity results in a formation large size silicon cluster. The intensity of the pulse laser beam to be irradiated onto the solid silicon is so controlled that the size of the silicon cluster be not more than 1 nanometer. During the formations of the silicon clusters, a temperature of the silicon substrate 51 is kept in the range from 100° to 300° C. to thereby prevent the silicon clusters from being diffused along the surface of the silicon oxide film 63.

Figure 14C:
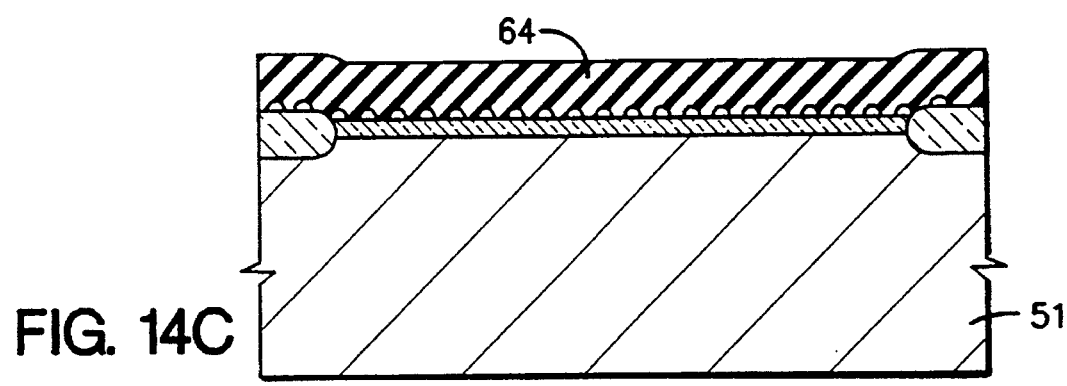

With referring to FIG. 14C, a strontium titanium oxide film 64 is deposited on the silicon clusters 61 and the surface of the silicon oxide film 63. This formation of the strontium titanium oxide film 64 is carried out by use of a sputtering apparatus provided with multiple chambers. This apparatus may show a vacuum pressure not more than $1 \times 10^{-9}$ Torr. As a target for sputtering, a strontium titanium oxide substrate is used. As a sputtering gas, Ar gas added with oxygen gas are used. At a growth rate of 2 nm/min the strontium titanium oxide film 64 is deposited until a thickness thereof comes into 50 nanometers.

Figure 14D:
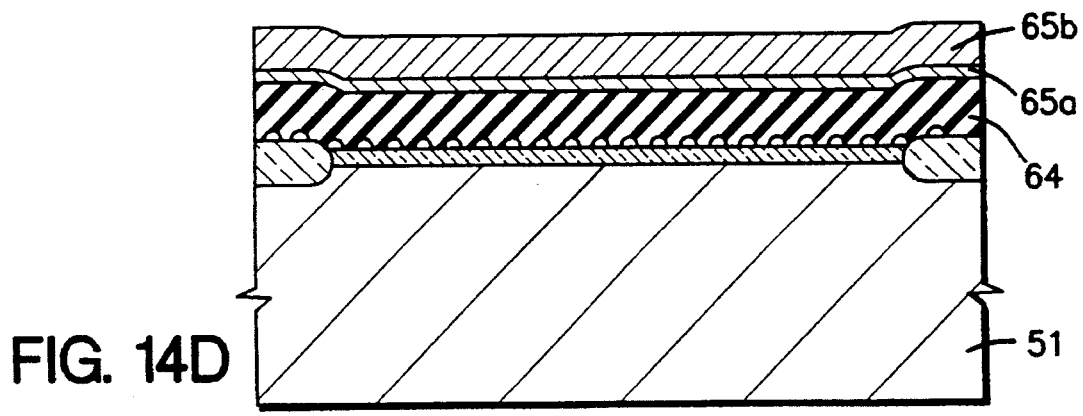

With referring to FIG. 14D, a platinum film 65a having a thickness of 10 nanometers is deposited on a surface of the strontium titanium oxide film 64. Subsequently, a tungsten film 65b having a thickness of 100 nanometers is deposited on a surface of the platinum film 65a. The depositions of the platinum film 65a and the tungsten film 65b are successively carried out by use of the multiple chamber sputtering apparatus.

Figure 14E:
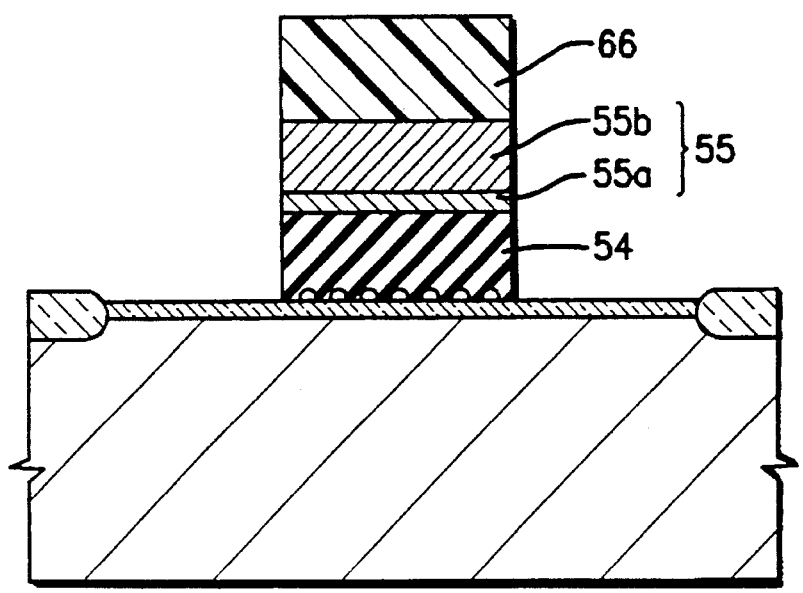

With referring to FIG. 14E, a photo-resist mask 66 is selectively form on a predetermined area of a surface of the tungsten film. The tungsten film 65b, the platinum film 65a and the strontium titanium oxide film 64 are in turn patterned by a dry etching using the photo-resist mask 66 to thereby form the second dielectric film 54 and a gate electrode 55 comprising the platinum film 55a and the tungsten film 55b.

Figure 14F:
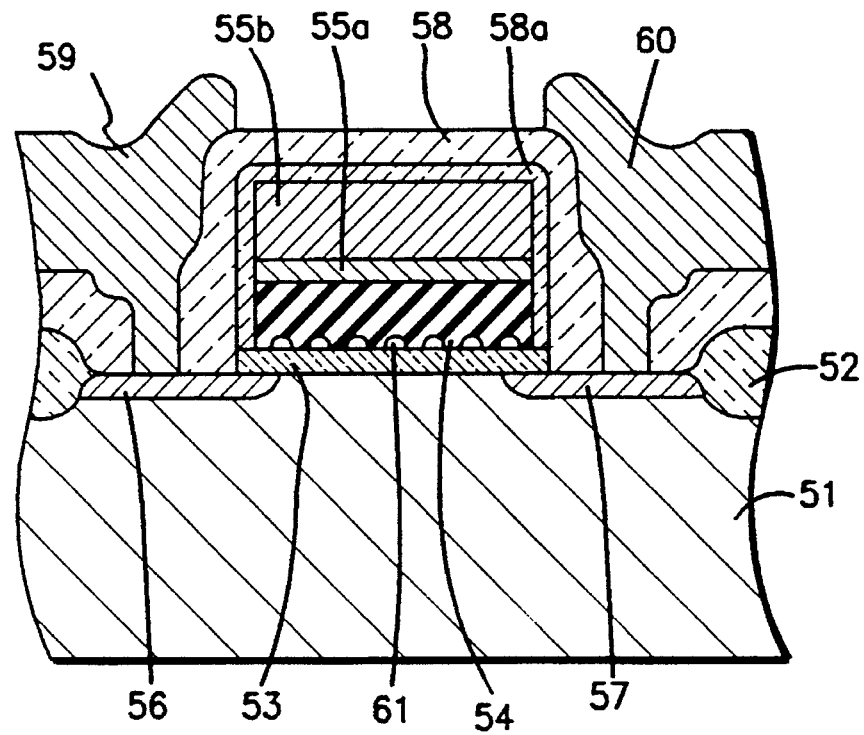

With referring to FIG. 14F, after removal of the used photo-resist mask 66 from the gate electrode 55, a coating insulator 58a is so formed as to cover side walls of the second dielectric film 54 and the gate electrode 55 and a top of gate electrode 55. There is subsequently carried out an ion-implantation of arsenic atoms into exposed surfaces of the silicon substrate 51, or into a part thereof not covered by the gate electrode 55 and the field oxide films 52. There is further carried out a heat treatment to cause diffusions of the implanted arsenic atoms to thereby form source and drain regions 56 and 57 in the exposed surface areas of the silicon substrate 51 not covered by the gate electrode and the field oxide films 52. The coating insulator 58a may play an important role to prevent the first and second dielectric films 53 and 54 from receiving any undesirable affection provided by the heat treatment for the above diffusions or from showing deteriorations of the dielectric properties thereof. An inter-layer insulator 58 is formed on an entire of the processed surface of the substrate 51 for subsequent formations of contact holes therein but over the source and drain regions 56 and 57. Source and drain electrodes 59 and 60 are formed to contact through the contact holes to the source and drain regions 56 and 57 thereby the fabrication processes are completed.

Whereas modifications of the present invention will no doubt be apparent to a person having ordinary skill in the art, to which the invention pertains, it is to be understood that the inventions as described and illustrated in the foregoing embodiments are by no means intended to be considered in a limiting sense. Accordingly, it is to be intended to cover by claims any modifications of the present invention which fall within spirit and scope of the invention.

What is claimed is:

1. A multi-layer structure comprising:

a semiconductor layer;

a first insulating layer formed on said semiconductor layer, said first insulating layer having a first dielectric constant $\epsilon_1$ and having a first thickness of $t_1$;

a second insulating layer formed on said first insulating layer layer, said second insulating layer having a second dielectric constant $\epsilon_2$ and having a second thickness of $t_2$; and a highly conductive layer formed on said second insulating layer so that when an electric field is applied between said semiconductor and highly conductive layers, electrons exhibit a direct tunneling across said first insulating layer, and that electrons having exhibited said direct tunneling from said semiconductor layer are trapped into interfacial trap centers at interface states on an interface between said first and second insulating layers:

wherein said first and second dielectric constants $\epsilon_1$ and $\epsilon_2$ and said first and second thicknesses $t_1$ and $t_2$ satisfy the conditions of $20 \leq \epsilon_2/\epsilon_1$, and $t_2/t_1 \leq \epsilon_2/\epsilon_1$.

2. The structure as claimed in claim 1, wherein said second insulating layer comprises strontium titanium oxide.

3. The structure as claimed in claim 1, wherein said second insulating layer comprises barium strontium titanate.

4. The structure as claimed in claim 1, wherein said second insulating layer comprises lead zirconia titanate.

5. The structure as claimed in claim 1, wherein said second insulating layer comprises bismuth titanate.

6. The structure as claimed in claim 1, wherein said second insulating layer comprises bismuth strontium tantalate.

7. The structure as claimed in claim 1, wherein said second insulating layer comprises a solid solution of at least two different materials which compositions are so varied that an energy band gap is gradually and continuously increased in a direction toward said metal layer from said first insulating layer.

8. The structure as claimed in claim 1, wherein said second insulating layer comprises a solid solution of at least two different materials which compositions are so varied that an energy band gap is gradually increased with step-like discontinuities in a direction toward said metal layer from said first insulating layer.

9. The structure as claimed in claim 1, further comprising a third insulating film being provided between said second insulating film and said metal layer, said third insulating film having a smaller dielectric constant and a larger energy band gap than a dielectric constant and an energy band gap of the second insulating film.

10. The structure as claimed in claim 9, wherein said third insulating layer comprises tantalum pantaoxide.

11. The structure as claimed in claim 1, further comprising semiconductor particles being so distributed as spaced apart one another on said interface between said first and second insulating layers.

12. The structure as claimed in claim 11, wherein said semiconductor particles have diameters approximately equal to or less than a thickness of a five-atomic layer.

13. The structure as claimed in claim 11, wherein said semiconductor particles comprise silicon.

14. The structure as claimed in claim 1, wherein said first insulating layer comprises silicon oxide.

15. The structure as claimed in claim 1, wherein said first insulating layer comprises silicon nitride.

16. The structure as claimed in claim 1, wherein said first insulating layer comprises a silicon oxide layer containing nitrogen atoms.

17. The structure as claimed in claim 1, wherein said highly conductive layer comprises a metal layer.

18. The structure as claimed in claim 17, wherein said metal layer comprises a metal selected from the group consisting of titanium nitride, ruthenate, palladium and platinum.

19. The structure as claimed in claim 1, wherein said first thickness $t_1$ of said first insulating layer is in the range from 2.5 nanometers to 5 nanometers.

20. The structure as claimed in claim 1, wherein said second thickness $t_2$ of said second insulating layer is in the range from 50 nanometers to 100 nanometers.

21. A metal-insulator-semiconductor gate insulating structure involved in a non-volatile memory device showing write-erase operations, said gate insulating structure comprising:

a semiconductor substrate;

a first insulating layer formed on said semiconductor substrate, said first insulating layer having a first dielectric constant $\epsilon_1$ and having a first thickness of $t_1$;

a second insulating layer formed on said first insulating layer layer, said second insulating layer having a second dielectric constant $\epsilon_2$ and having a second thickness of $t_2$; and a gate electrode of a metal layer formed on said second insulating layer so that when a voltage is applied between said gate electrode and said semiconductor substrate, electrons exhibit a direct tunneling across said first insulating layer for said write-erase operations, and that electrons having exhibited said direct tunneling from said semiconductor substrate are trapped into interfacial trap centers at interface states on an interface between said first and second insulating layers:

wherein said first and second dielectric constants $\epsilon_1$ and $\epsilon_2$ and said first and second thicknesses $t_1$ and $t_2$ satisfy the conditions of $20 \leq \epsilon_2/\epsilon_1$, and $t_2/t_1 \leq \epsilon_2/\epsilon_1$.

22. The structure as claimed in claim 21, wherein said second insulating layer comprises strontium titanium oxide.

23. The structure as claimed in claim 21, wherein said second insulating layer comprises barium strontium titanate.

24. The structure as claimed in claim 21, wherein said second insulating layer comprises lead zirconia titanate.

25. The structure as claimed in claim 21, wherein said second insulating layer comprises bismuth titanate.

26. The structure as claimed in claim 21, wherein said second insulating layer comprises bismuth strontium tantalate.

27. The structure as claimed in claim 21, wherein said second insulating layer comprises a solid solution of at least two different materials which compositions are so varied that an energy band gap is gradually and continuously increased in a direction toward said gate electrode from said first insulating layer.

28. The structure as claimed in claim 21, wherein said second insulating layer comprises a solid solution of at least two different materials which compositions are so varied that an energy band gap is gradually increased with step-like discontinuities in a direction toward said gate electrode from said first insulating layer.

29. The structure as claimed in claim 21, further comprising a third insulating film being provided between said second insulating film and said gate electrode, said third insulating film having a smaller dielectric constant and a larger energy band gap than a dielectric constant and an energy band gap of the second insulating film.

30. The structure as claimed in claim 29, wherein said third insulating layer comprises tantalum pantaoxide.

31. The structure as claimed in claim 21, further comprising semiconductor particles being so distributed as spaced apart from each other on said interface between said first and second insulating layers.

32. The structure as claimed in claim 31, wherein said semiconductor particles have diameters approximately equal to or less than a thickness of a five-atomic layer.

33. The structure as claimed in claim 31, wherein said semiconductor particles comprise silicon.

34. The structure as claimed in claim 21, wherein said first insulating layer comprises silicon oxide.

35. The structure as claimed in claim 21, wherein said first insulating layer comprises silicon nitride.

36. The structure as claimed in claim 21, wherein said first insulating layer comprises a silicon oxide layer containing nitrogen atoms.

37. The structure as claimed in claim 21, wherein said gate electrode comprises a metal selected from the group consisting of titanium nitride, ruthenate, palladium and platinum.

38. The structure as claimed in claim 21, wherein said semiconductor substrate comprises silicon.

39. The structure as claimed in claim 21, wherein said first thickness $t_1$ of said first insulating layer is in the range from 2.5 nanometers to 5 nanometers.

40. The structure as claimed in claim 21, wherein said second thickness $t_2$ of said second insulating layer is in the range from 50 nanometers to 100 nanometers.

41. A non-volatile semiconductor memory transistor having a metal-insulator-semiconductor gate insulating structure showing write-erase operations, said transistor comprising:

a semiconductor substrate;

source and drain regions formed on a surface of said semiconductor substrate ;

a channel region defined between said source and drain regions on said surface of said semiconductor substrate;

a first gate insulating layer formed on said channel region, said first gate insulating layer having a first dielectric constant $\epsilon_1$ and having a first thickness of $t_1$;

a second gate insulating layer formed on said first gate insulating layer layer, said second gate insulating layer having a second dielectric constant $\epsilon_2$ and having a second thickness of $t_2$; and a gate electrode of a metal layer formed on said second gate insulating layer so that when a voltage is applied between said gate electrode and said semiconductor substrate, electrons exhibit a direct tunneling across said first gate insulating layer for said write-erase operations, and that electrons having exhibited said direct tunneling from said channel region are trapped into interfacial trap centers at interface states on an interface between said first and second gate insulating layers:

wherein said first and second dielectric constants $\epsilon_1$ and $\epsilon_2$ and said first and second thicknesses $t_1$ and $t_2$ satisfy the conditions of $20 \leq \epsilon_2/\epsilon_1$, and $t_2/t_1 \leq \epsilon_2/\epsilon_1$.

42. The structure as claimed in claim 41, wherein said second gate insulating layer comprises strontium titanium oxide.

43. The structure as claimed in claim 41, wherein said second gate insulating layer comprises barium strontium titanate.

44. The structure as claimed in claim 41, wherein said second gate insulating layer comprises lead zirconia titanate.

45. The structure as claimed in claim 41, wherein said second gate insulating layer comprises bismuth titanate.

46. The structure as claimed in claim 41, wherein said second gate insulating layer comprises bismuth strontium tantalate.

47. The structure as claimed in claim 41, wherein said second gate insulating layer comprises a solid solution of at least two different materials which compositions are so varied that an energy band gap is gradually and continuously increased in a direction toward said gate electrode from said first gate insulating layer.

48. The structure as claimed in claim 41, wherein said second gate insulating layer comprises a solid solution of at least two different materials which compositions are so varied that an energy band gap is gradually increased with step-like discontinuities in a direction toward said gate electrode from said first gate insulating layer.

49. The structure as claimed in claim 41, further comprising a third insulating film being provided between said second insulating film and said gate electrode, said third insulating film having a smaller dielectric constant and a larger energy band gap than a dielectric constant and an energy band gap of the second insulating film.

50. The structure as claimed in claim 49, wherein said third gate insulating layer comprises tantalum pantaoxide.

51. The structure as claimed in claim 41, further comprising semiconductor particles being so distributed as spaced apart from each other on said interface between said first and second gate insulating layers.

52. The structure as claimed in claim 51, wherein said semiconductor particles have diameters approximately equal to or less than a thickness of a five-atomic layer.

53. The structure as claimed in claim 51, wherein said semiconductor particles comprise silicon.

54. The structure as claimed in claim 41, wherein said first gate insulating layer comprises silicon oxide.

55. The structure as claimed in claim 41, wherein said first gate insulating layer comprises silicon nitride.

56. The structure as claimed in claim 41, wherein said first gate insulating layer comprises a silicon oxide layer containing nitrogen atoms.

57. The structure as claimed in claim 41, wherein said gate electrode comprises a metal selected from the group consisting of titanium nitride, ruthenate, palladium and platinum.

58. The structure as claimed in claim 41, wherein said semiconductor substrate comprises silicon.

59. The structure as claimed in claim 41, wherein said first thickness $t_1$ of said first gate insulating layer is in the range from 2.5 nanometers to 5 nanometers.

60. The structure as claimed in claim 41, wherein said second thickness $t_2$ of said second gate insulating layer is in the range from 50 nanometers to 100 nanometers.

* * * * *